United States Patent
King et al.

(10) Patent No.: US 11,121,146 B2
(45) Date of Patent: Sep. 14, 2021

(54) FORMING TERMINATIONS IN STACKED MEMORY ARRAYS

(71) Applicant: Micron Technology, Inc., Boise, ID (US)

(72) Inventors: Matthew J. King, Boise, ID (US); Anilkumar Chandolu, Boise, ID (US); Indra V. Chary, Boise, ID (US); Darwin A. Clampitt, Wilder, ID (US); Gordon Haller, Boise, ID (US); Thomas George, Boise, ID (US); Brett D. Lowe, Boise, ID (US); David A. Daycock, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 278 days.

(21) Appl. No.: 16/159,955

(22) Filed: Oct. 15, 2018

(65) Prior Publication Data
US 2020/0119036 A1   Apr. 16, 2020

(51) Int. Cl.
*H01L 27/11573* (2017.01)
*H01L 27/11578* (2017.01)
(Continued)

(52) U.S. Cl.
CPC ...... *H01L 27/11573* (2013.01); *H01L 21/762* (2013.01); *H01L 21/76808* (2013.01);
(Continued)

(58) Field of Classification Search
CPC ......... H01L 27/11575; H01L 27/11573; H01L 27/11526; H01L 21/76808; H01L 21/76877; H01L 21/76816
See application file for complete search history.

(56) References Cited

U.S. PATENT DOCUMENTS 9,397,043 B1 * 7/2016 Minemura ........ H01L 27/11575
9,431,336 B2 * 8/2016 Lim .................. H01L 21/76816
(Continued)

OTHER PUBLICATIONS

U.S. Appl. No. 16/029,144, entitled "Integrated Assemblies Having Thicker Semiconductor Material Along One Region of a Conductive Structure Than Along Another Region, and Methods of Forming Integrated Assemblies", filed Jul. 6, 2018, (63 pgs.).
(Continued)

*Primary Examiner* — Zandra V Smith
*Assistant Examiner* — Abbigale A Boyle
(74) *Attorney, Agent, or Firm* — Brooks, Cameron & Huebsch, PLLC

(57) ABSTRACT

A termination opening can be formed through the stack alternating dielectrics concurrently with forming contact openings through the stack. A termination structure can be formed in the termination opening. An additional opening can be formed through the termination structure and through the stack between groups of semiconductor structures that pass through the stack. In another example, an opening can be formed through the stack so that a first segment of the opening is between groups of semiconductor structures in a first region of the stack and a second segment of the opening is in a second region of the stack that does not include the groups of semiconductor structures. A material can be formed in the second segment so that the first segment terminates at the material. In some instances, the material can be implanted in the dielectrics in the second region through the second segment.

18 Claims, 29 Drawing Sheets

(51) Int. Cl.
*H01L 21/768* (2006.01)
*H01L 21/762* (2006.01)
*H01L 27/1157* (2017.01)
*H01L 27/11575* (2017.01)

(52) U.S. Cl.
CPC .. *H01L 21/76816* (2013.01); *H01L 21/76877* (2013.01); *H01L 27/1157* (2013.01); *H01L 27/11575* (2013.01); *H01L 27/11578* (2013.01)

(56) References Cited

U.S. PATENT DOCUMENTS

| | | | | |
|---|---|---|---|---|
| 9,496,272 | B2* | 11/2016 | Cernea | H01L 27/11556 |
| 9,773,805 | B1 | 9/2017 | Li et al. | |
| 9,806,093 | B2* | 10/2017 | Toyama | H01L 21/76877 |
| 9,853,043 | B2* | 12/2017 | Lu | H01L 21/76877 |
| 9,972,641 | B1* | 5/2018 | Zhang | H01L 23/5226 |
| 10,211,215 | B1* | 2/2019 | Ishii | H01L 27/11575 |
| 10,249,640 | B2* | 4/2019 | Yu | H01L 23/5226 |
| 2012/0208347 | A1 | 8/2012 | Hwang et al. | |
| 2015/0194435 | A1* | 7/2015 | Lee | H01L 27/11582 |
| | | | | 257/329 |
| 2017/0250108 | A1 | 8/2017 | Mathew et al. | |
| 2018/0047739 | A1* | 2/2018 | Dorhout | H01L 27/11582 |

OTHER PUBLICATIONS

U.S. Appl. No. 15/992,959, entitled "Arrays of Elevationally-Extending Strings of Memory Cells and Methods of Forming an Array of Elevationally-Extending Strings of Memory Cells", filed May 30, 2018, (41 pgs.).

U.S. Appl. No. 15/710,432, entitled "Methods Used in Forming an Array of Elevationally-Extending Transistors" filed Sep. 20, 2017, (56 pgs.).

* cited by examiner

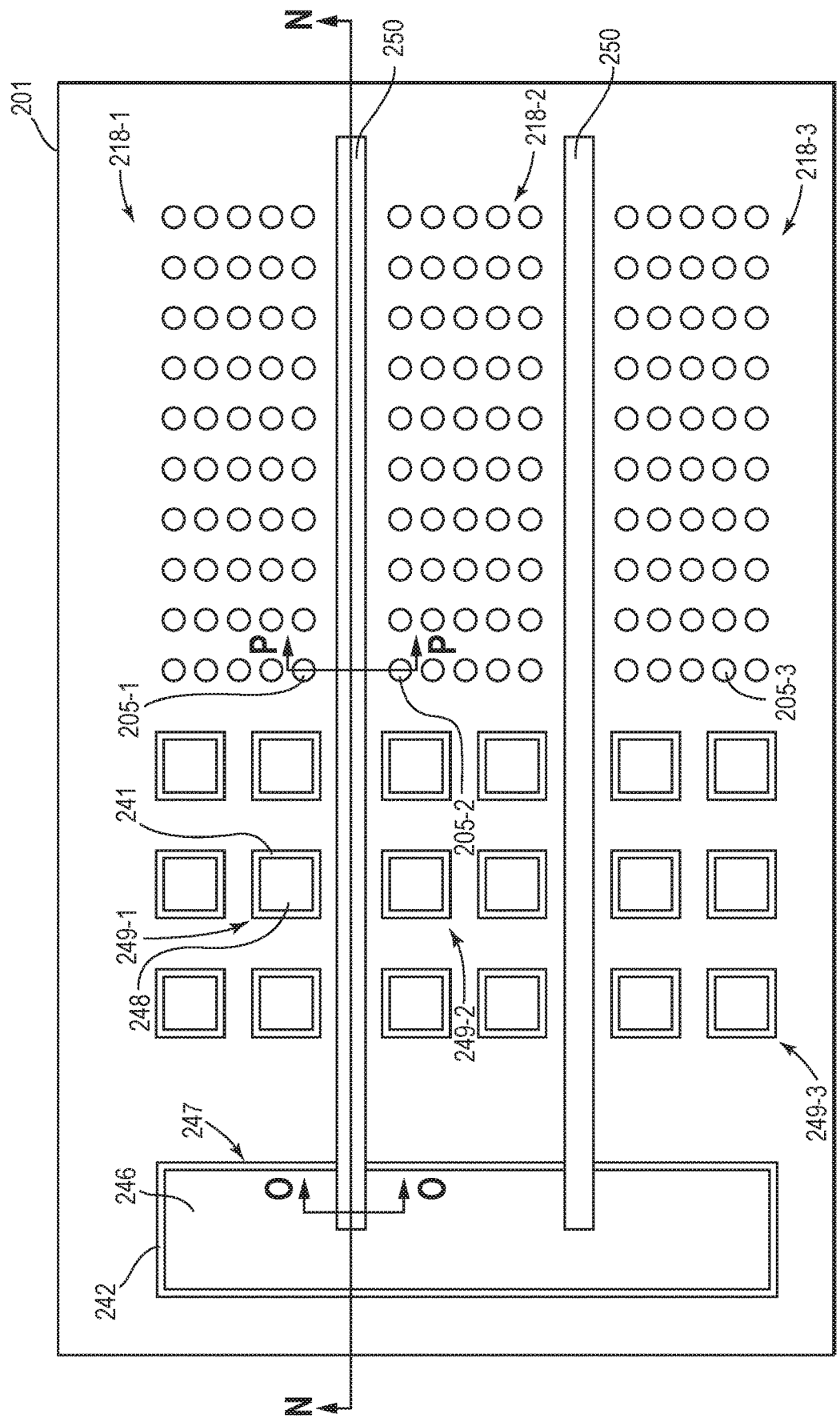

FORMING TERMINATIONS IN STACKED MEMORY ARRAYS

TECHNICAL FIELD

The present disclosure relates generally to memory arrays and their formation, and more particularly, to forming terminations in stacked memory arrays.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), synchronous dynamic random access memory (SDRAM), resistive memory (e.g., RRAM), and flash memory, among others.

Memory devices can be utilized as volatile and non-volatile data storage for a wide range of electronic applications. Volatile memory may require power to maintain its data, whereas non-volatile memory may provide persistent data by retaining stored data when not powered. Flash memory, which is just one type of non-volatile memory, can use a one-transistor memory cells that allow for high memory densities, high reliability, and low power consumption. Non-volatile memory may be used in, for example, personal computers, portable memory sticks, solid state drives (SSDs), digital cameras, cellular telephones, portable music players such as MP3 players, movie players, and other electronic devices. Memory cells can be arranged into arrays, with the arrays being used in memory devices.

Memory arrays can include groups of memory cells, such as blocks, sub-blocks, strings, etc. In some examples, a memory array can be a stacked memory array that can be referred to as a three-dimensional memory array. The memory cells at a common location (e.g., at a common vertical level) in a stacked memory array, for example, may form a tier of memory cells. The memory cells in each tier can be commonly coupled to a common assess line, such as a word line. In some examples, a group of memory cells can include memory cells from different tiers coupled in series to form a string of series-coupled memory cells (e.g., a NAND string) between a select transistor coupled to a source and a select transistor coupled to a data line, such as a bit line.

In some examples, the formation of stacked memory arrays can include a replacement gate process. After semiconductor structures (e.g., semiconductor pillars) are formed through a stack of alternating dielectrics, a replacement gate process can be used to remove dielectrics from the stack at levels at which memory cells are to be formed adjacent to the semiconductor structures and to form conductive access lines (e.g., metal access lines) in place of the removed dielectrics. In some examples, an opening (e.g., an access opening), such as a slot or slit, can be formed through the stack to provide access to the various levels in the stack. A removal material, such as an etchant, can be supplied through the openings to remove the dielectrics. A conductor (e.g., metal) can also be supplied through the openings to form the access lines.

DETAILED DESCRIPTION

Figure 1:
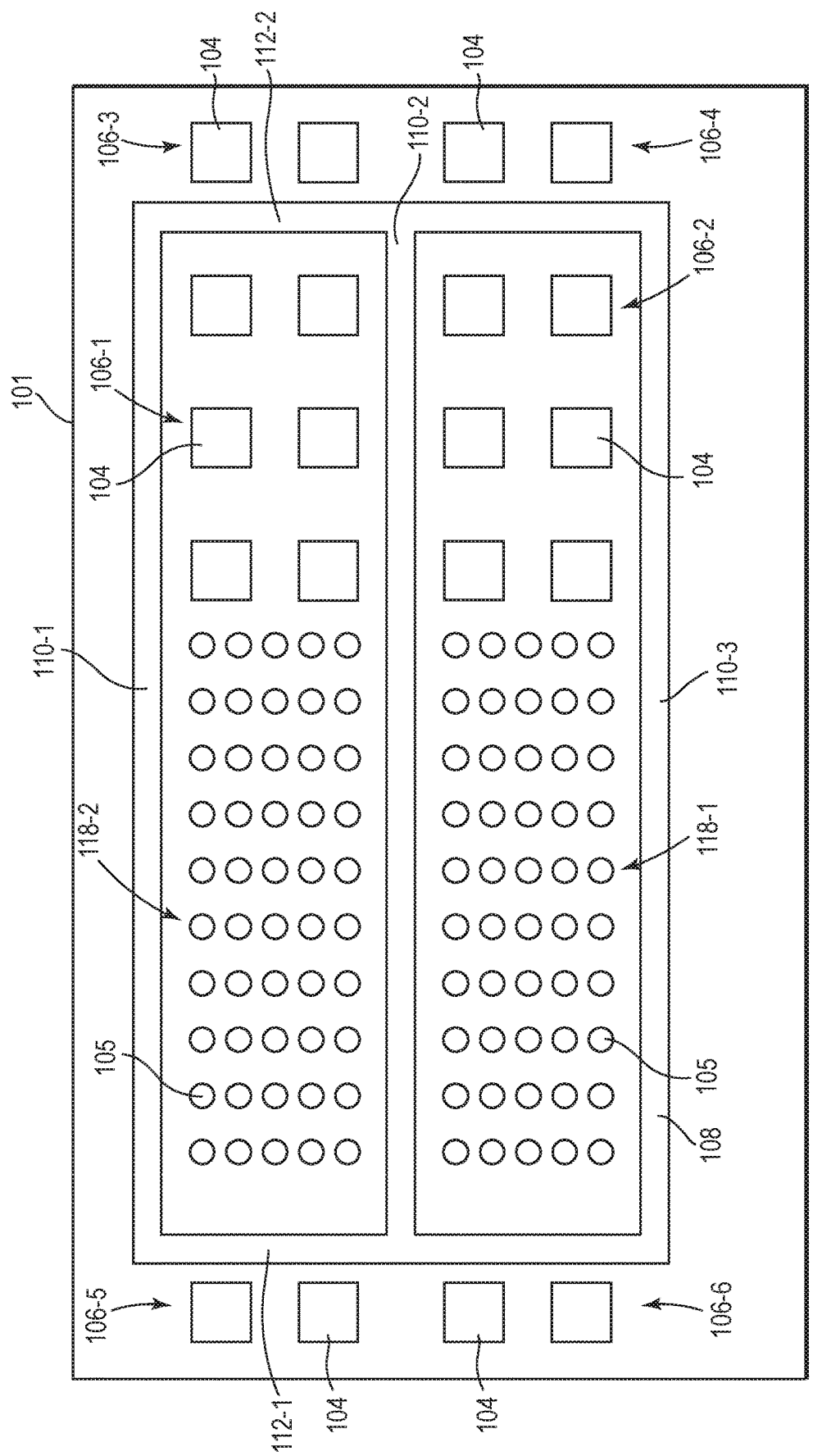
FIG. 1 is a top view at a particular processing stage associated with forming a stacked memory array, according to the background art.

Stacked memory arrays and their formation are disclosed herein. For example, methods for forming stacked memory arrays can include various ways to terminate the openings, such as access openings, that can be formed through a stack of alternating dielectrics to provide access to dielectrics at levels in the stack at which memory cells are to be formed for removal and subsequent replacement with metal during replacement gate processes. The terminations can prevent the removal of the dielectrics in particular regions of the stacks, and thus can prevent the formation of the metal in the particular regions that could result in shorts between adjacent blocks of memory cells.

In previous approaches, the access openings can be formed between groups of semiconductors concurrently with forming transverse openings (e.g., during a single etch) that are transverse to the access openings. For example, the access openings can terminate at the transverse openings to form T-intersections. However, the T-intersections can be difficult to form. Formation of the transverse openings can relieve stress in the stack that can result in the movement of the semiconductor structures. Moreover, the transverse openings can form discontinuities in the stack that can decouple semiconductors in the stack from other regions of the stack, allowing the semiconductor structures to move while the metal is being formed. The movement of the semiconductor structures can make it difficult to align data line contacts with the semiconductor structures during subsequent processing. Various embodiments of the present disclosure can utilize terminations that can help isolate the blocks of memory cells from each other without forming "T-intersections," thereby avoiding the difficulties and drawbacks associated therewith.

In an example embodiment, a stack of alternating first and second dielectrics can be formed. A termination opening can be formed through the stack concurrently with forming a set of contact openings through the stack. A sacrificial material can be formed in the termination opening, and the contact openings can be closed with the sacrificial material. The sacrificial material can then be removed from the termination opening while covering the closed contact openings. A termination structure can then be formed in the termination opening after removing the sacrificial material. An additional opening can then be formed through the termination structure and through the stack between first and second groups of semiconductor structures that pass through the stack.

Forming the termination opening concurrently with the formation of contact openings and forming the additional opening after the termination structure is formed can mitigate the stress relief and the corresponding movement of the semiconductor structures compared to the stress relief and the corresponding movement of the semiconductor structures associated with forming the transverse openings concurrently with access openings after forming contacts in the contact openings, as may be done in previous approaches.

In some examples, an opening can be formed through a stack so that a first segment of the opening is between groups of semiconductor structures and a second segment of the opening is in a region of the stack that does not include the groups of semiconductor structures. A material can be formed in the second segment so that the first segment terminates at the material. In some instances, the material can be implanted in the dielectrics in the region of the stack that does not include the groups of semiconductor structures through the second segment. For example, the material can prevent the dielectrics in the region of the stack that does not include the groups of semiconductor structures from being removed and replaced with metal and can thereby prevent shorts between blocks of memory cells that correspond to the groups of semiconductor structures. As such, a segment that is transverse the opening can be avoided, and thus the difficulties and drawbacks associated with forming such segments, as discussed previously, can be mitigated.

FIG. 1 is a top view at a particular processing stage associated with forming a stacked memory array, according to the background art. In FIG. 1, a stack 101 of alternating dielectrics, such as nitride alternating with oxide, includes sets 106-1 to 106-6 of contacts 104 passing through stack 101 and groups 118-1 and 118-2 of semiconductor structures 105 passing through stack 101.

Contacts 104 can be formed after semiconductor structures 105 are formed. In some examples, memory cells can be partially formed adjacent to semiconductor structures 105 (e.g., at levels in stack 101 containing the nitride) before contacts 104 are formed.

An opening 108 is formed through stack 101 after contacts 104 are formed. In some examples, a removal material selective to nitride can be supplied through opening 108 to remove the nitride, leaving the oxide. Contacts 104 can be electrical contacts and/or support contacts. For example, the electrical contacts can be coupled to routing circuitry of the array. The electrical and support contacts can provide support that acts to stabilize and restrict movement of stack 101 during and after the removal of the nitride.

In some examples, the partially formed memory cells can be completed by accessing the memory cells through opening 108. Metal, such as tungsten, can be supplied through opening 108 to form lines, such as access lines that can be coupled to the memory cells and that can extend into the regions including sets 106-1 and 106-2 of contacts 104 so that the contacts 104 of sets 106-1 and 106-2 pass through oxide alternating with metal, for example. For instance, access lines corresponding to group 118-1 can extend into the region including set 106-1, and access lines corresponding to group 118-2 can extend into the region including set 106-2. In some examples, formation of opening 108, removal of the nitride, completing the memory cells, and forming the access lines can be formed as part of a replacement gate process.

A dielectric can be formed in opening 108 to electrically isolate the access lines corresponding to group 118-1 from access lines corresponding to group 118-2. Opening 108 can include segments 110-1 to 110-3 and segments 112-1 and 112-2 that are transverse to segments 110-1 to 110-3. For example, segments 110-1 to 110-3 and segment 112-1 form respective T-intersections, and segments 110-1 to 110-3 and segment 112-2 form respective T-intersections.

In some examples, opening 108 can be formed during a single process step (e.g., during a single etch) that can form the segments 110-1 to 110-3 and segments 112-1 and 112-2 concurrently. However, as an example, the T-intersections can be formed by performing a first etch through the stack 101 to form segments 110-1 to 110-3 and a second etch through the stack 101 to form segments 112-1 and 112-2. Forming such "T-intersections" can be difficult and can have various drawbacks. For instance, forming segments 112-1 and 112-2 can result in over etching or under etching, which can result in inadequate separation of the groups 118-1 and 118-2 or can prevent adequate electrical isolation.

Segment 112-1 can form a continuous space (e.g., discontinuity) in stack 101 that can decouple the region having sets 106-5 and 106-6 from the ends of groups 118-1 and 118-2. Segment 112-2 can form a continuous space in stack 101 that can decouple the region having sets 106-3 and 106-4 from the ends of sets 106-1 and 106-2. In some examples, stress in stack 101 that can occur as a result of processing prior to the formation of opening 108 can be released during the formation of opening 108, especially as a result of the formation segments 112-1 and 112-2. For example, semiconductor structures 105 can move after opening 108 is formed due to the stress release, especially in a direction parallel to segments 110 in the regions adjacent to segments 112-1 and 112-2, as a result of the discontinuities caused by segments 112-1 and 112-2. Moreover, the discontinuities can result in additional movement during the removal of the nitride and/or during the formation of the access lines.

The movement can make it difficult to align data line contacts with semiconductor structures 105, such as to couple data lines to the semiconductor structures 105. In some instances, the movement of semiconductor structures 105 can be relatively large at and near the ends of the ends of groups 118-1 and 118-2 and relatively little away from the ends. As such, the memory cells adjacent to the semiconductor structures 105 at and near the ends of groups 118-1 and 118-2 can be "dummy" memory cells (e.g., cells that are not used to store data). However, this can reduce the total number of memory cells available for data storage.

Figure 2A:
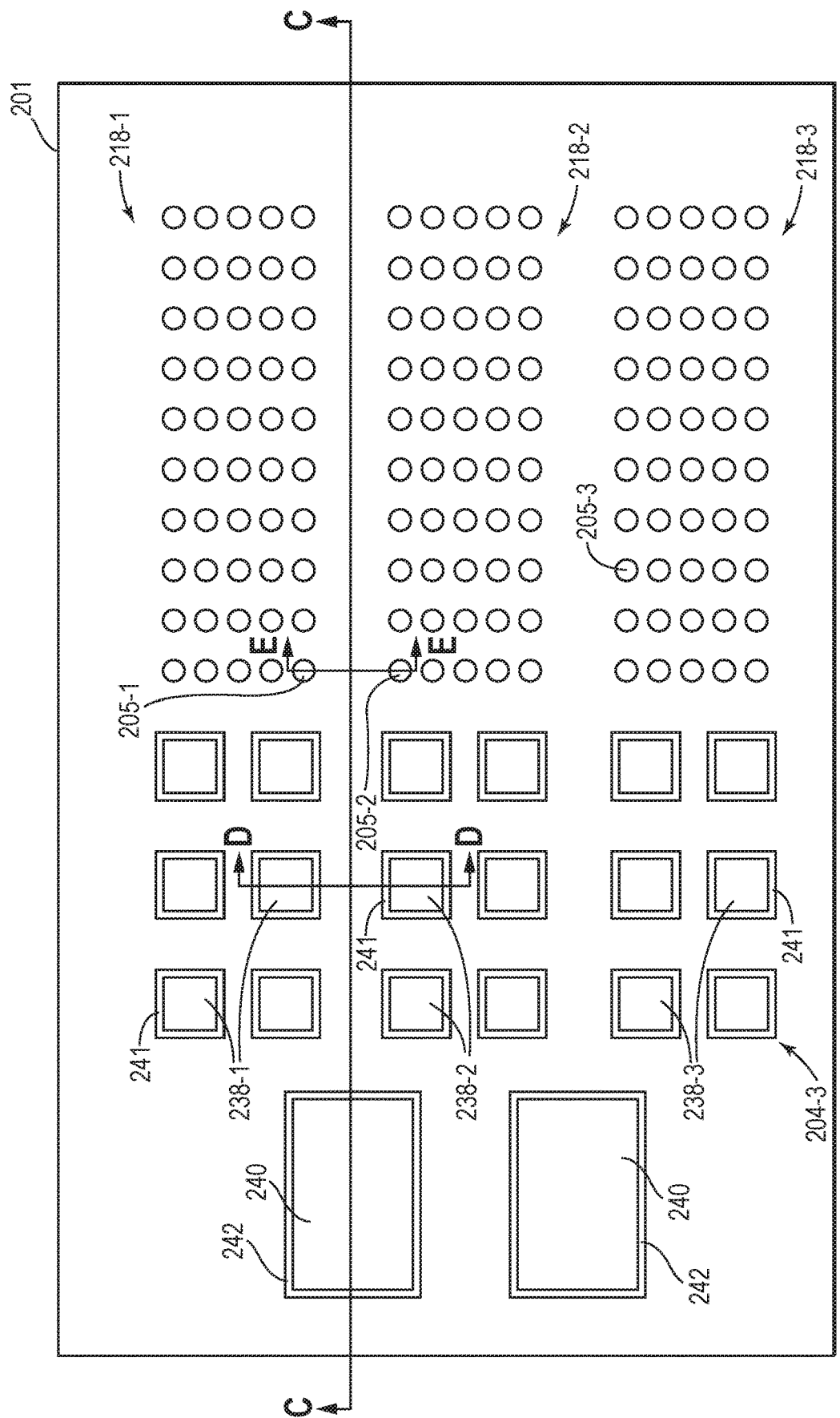
FIGS. 2A-2P are various views corresponding to particular stages of processing associated with forming a stacked memory array in accordance with a number of embodiments of the present disclosure.
Figure 2B:
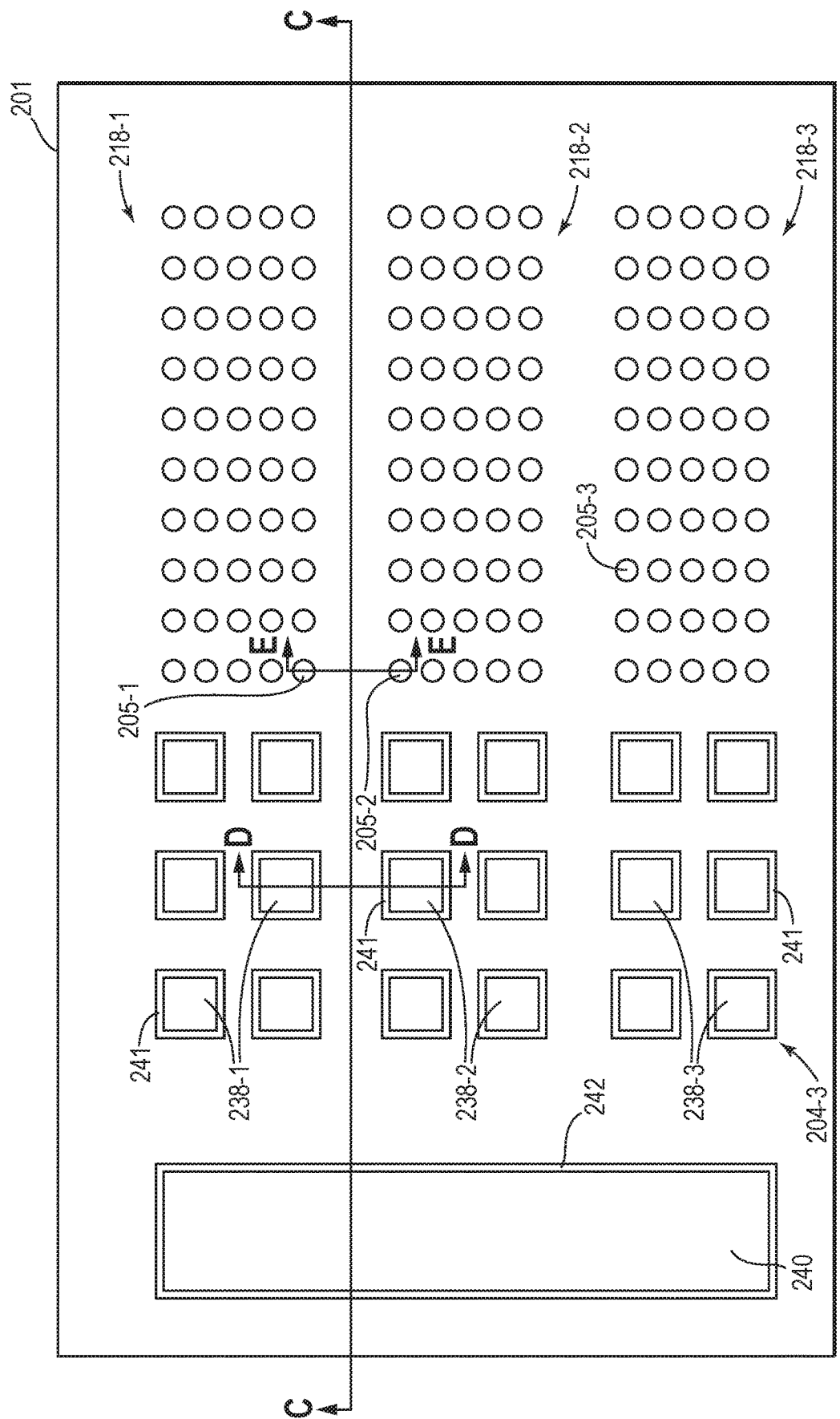
Figure 2C:
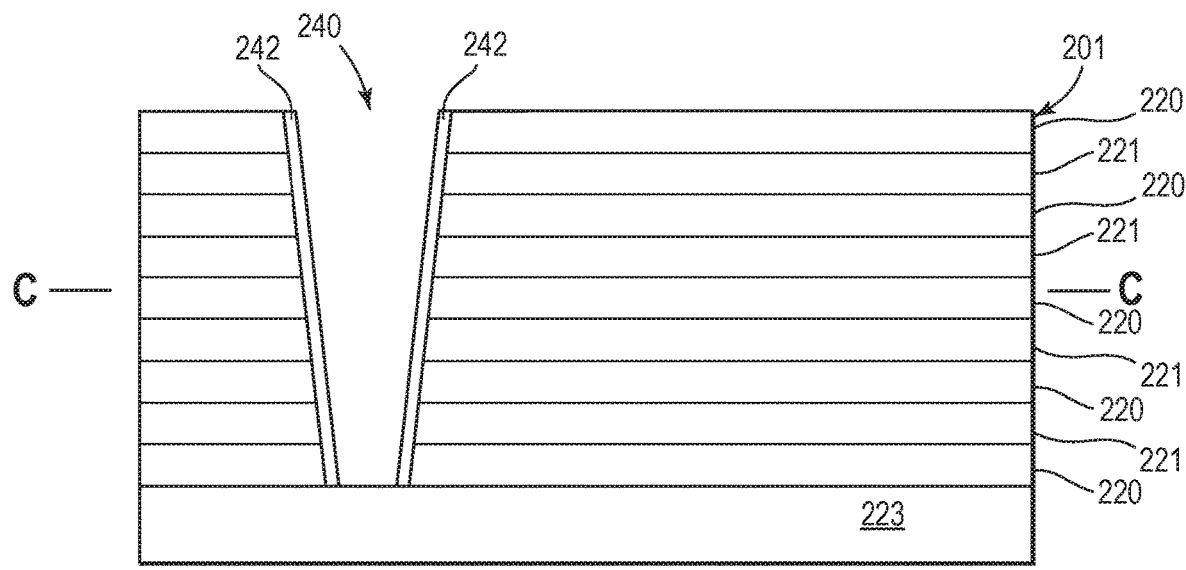
Figure 2D:
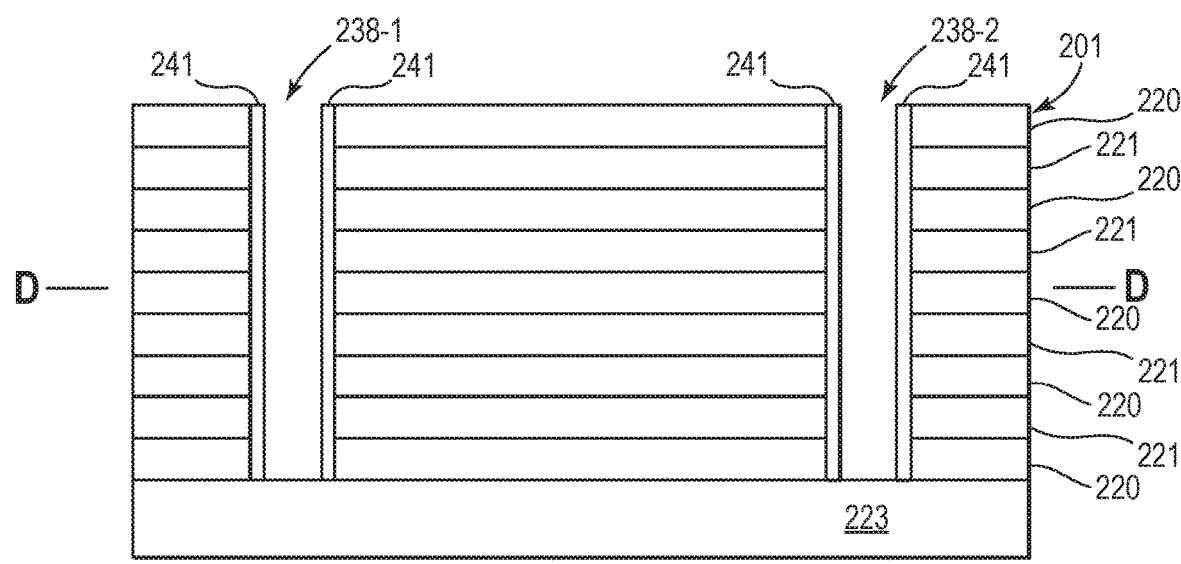
Figure 2E:
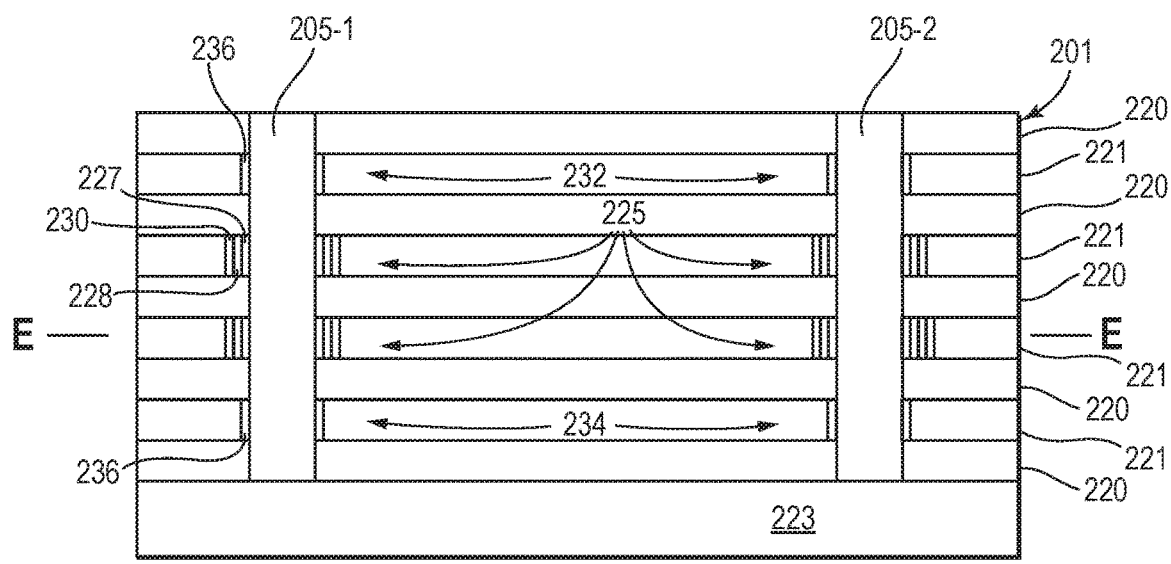

FIG. 2A is a top view corresponding to a particular stage of processing associated with forming a stacked memory array in accordance with a number of embodiments of the present disclosure. In some examples, the array can be a three-dimensional NAND memory array. FIG. 2B is a top view corresponding to a particular stage of processing associated with forming a stacked memory array in accordance with a number of embodiments of the present disclosure. FIG. 2C is a cross-section viewed along line C-C in FIGS. 2A and 2B during the processing stages in FIGS. 2A and 2B in accordance with a number of embodiments of the present disclosure. FIG. 2D is a cross-section viewed along line D-D in FIGS. 2A and 2B during the processing stages in FIGS. 2A and 2B in accordance with a number of embodiments of the present disclosure. FIG. 2E is a cross-section viewed along line E-E in FIGS. 2A and 2B during the processing stages in FIGS. 2A and 2B in accordance with a number of embodiments of the present disclosure. FIGS. 2A to 2E can correspond to a processing stage that can occur after a number of processing stages have occurred. In some examples, a processing stage can include a number of steps that can have a number of sub-steps.

A group 218-1 of semiconductor structures 205-1 passes through a stack 201 of alternating dielectrics 220 and 221 formed on (e.g., over) a semiconductor 223, as shown in FIGS. 2A, 2B, and 2E. A group 218-2 of semiconductor structures 205-2 passes through stack 201, and a group 218-3 of semiconductor structures 205-3 passes through stack 201. In some examples, stack 201 can include a stair-step structure at one or both ends of the structures in FIGS. 2A and 2B so that each stair (e.g., step) in the stair-step structure can include a dielectric 221 over an adjacent dielectric 220, for example. In some examples, groups 218-1 to 218-3 can correspond to blocks of memory cells that are to be formed in stack 201. For example, a block of memory cells can refer to a group of memory cells that is commonly erased.

Semiconductor structures 205-1 to 205-3 and semiconductor 223 can be polysilicon, silicon conductively doped to have a p-type conductivity (e.g., single crystal p⁻ silicon), or the like. Dielectrics 220 can be oxide, and dielectrics 221 can be nitride.

In some examples, memory cells 225 can be partially formed adjacent to each semiconductor structure 205 at levels of stack 201 having dielectrics 221. For example, as shown in FIG. 2E, a tunnel dielectric 227 (e.g., tunnel oxide) of a memory cell 225 can be formed adjacent to a semiconductor structure 205; a charge storage structure 228 (e.g., a charge trap, floating gate, etc.) can be formed adjacent to the tunnel dielectric 227; and a blocking dielectric 230 (e.g., oxide) can be formed adjacent to the charge storage structure 228. A dielectric 221 can be adjacent to the blocking dielectric 230. In some examples, tunnel dielectric 227, charge storage structure 228, and blocking dielectric 230 can wrap completely around (e.g., completely surround) the corresponding semiconductor structure 205.

In some examples, as shown in FIG. 2E, a select transistor 232 can be partially formed adjacent to each semiconductor structure 205 at a level of stack 201 having an uppermost dielectric 221, and a select transistor 234 can be partially formed adjacent to each semiconductor structure 205 at a level of stack 201 having a lowermost dielectric 221. For example, a gate dielectric 236 (e.g., gate oxide) of select transistors 232 and 234 can be formed adjacent to each semiconductor structure 205. A dielectric 221 can be adjacent to gate dielectrics 236. In some examples, gate dielectric 236 can wrap completely around the corresponding semiconductor structure 205. Note that semiconductor structures 205 can be formed prior to the processing stage depicted in FIGS. 2A to 2E, and select transistors 232 and 234 and memory cells 225 can be partially formed prior to the processing stage depicted in FIGS. 2A to 2E.

In the processing stage corresponding to FIGS. 2A to 2E, sets of openings 238-1 to 238-3, such as contact openings, are formed (e.g., etched) through stack 201, stopping at an upper surface of or in semiconductor 223, as shown in FIGS. 2A, 2B, and 2D. Openings 240, such as termination openings, are formed (e.g., etched) through stack 201 concurrently with forming openings 238-1 to 238-3, stopping at an upper surface of or in semiconductor 223, as shown in FIGS. 2A, 2B, and 2C. In some examples, dielectric liners 241 can be formed in openings 238 and dielectric liners 242 can be formed in openings 240 concurrently. For example, dielectric liners 241 and 242 can be oxide liners.

The separated openings 240 in FIG. 2A allow the region that includes the separated openings 240 to be coupled to the region that includes contact openings 238 and the semiconductor structures 205. This avoids the decoupling associated with segment 112-2 in FIG. 1 and can reduce the amount movement of semiconductor structures 205 compared to the amount of movement of semiconductor structures 105 associated with the formation of segment 112-2.

Figure 2F:
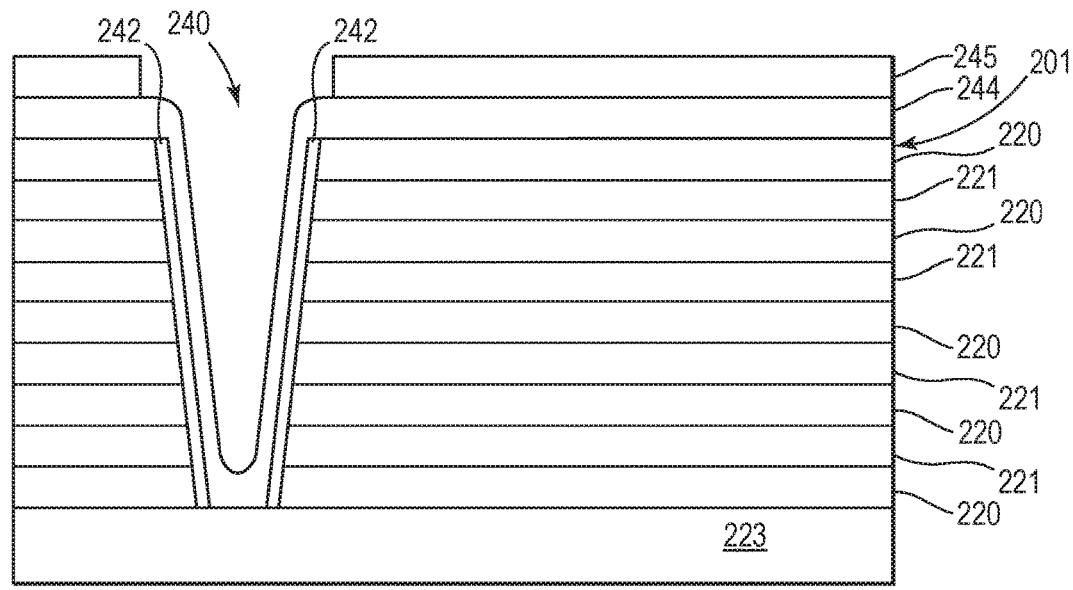
Figure 2G:
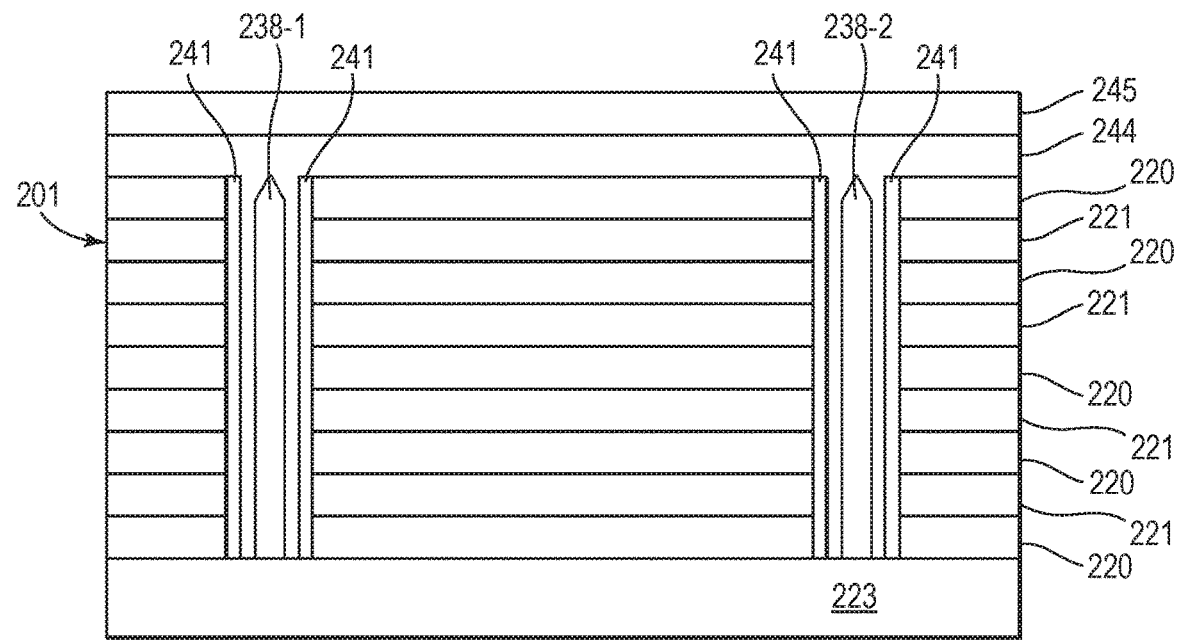

FIG. 2F is a cross-section corresponding to the cross-section in FIG. 2C at stage of processing following the stage of processing corresponding to FIG. 2C in accordance with a number of embodiments of the present disclosure. FIG. 2G is a cross-section corresponding to the cross-section in FIG. 2D at stage of processing following the stage of processing corresponding to FIG. 2D in accordance with a number of embodiments of the present disclosure.

A sacrificial material 244, such as carbon, is formed over the uppermost dielectric 220 in FIGS. 2F and 2G. Sacrificial material 244 is formed adjacent to liners 242 in openings 240 and lines openings 240 lined with liners 242 without closing openings 240, as shown for a representative opening 240 in FIG. 2F. Sacrificial material 244 closes openings 238 lined with liners 241 adjacent to the tops of openings 238, as shown in FIG. 2G. For example, sacrificial material 244 pinches off adjacent to the tops of openings 238 before completely filling openings 238. Subsequently, a mask 245 (e.g., of photoresist) is formed over sacrificial material 244 and the closed contact openings 238. Mask 245 is patterned to expose the sacrificial material 244 in openings 240 while covering the remainder of sacrificial material 244, as shown in FIGS. 2F and 2G.

Figure 2H:
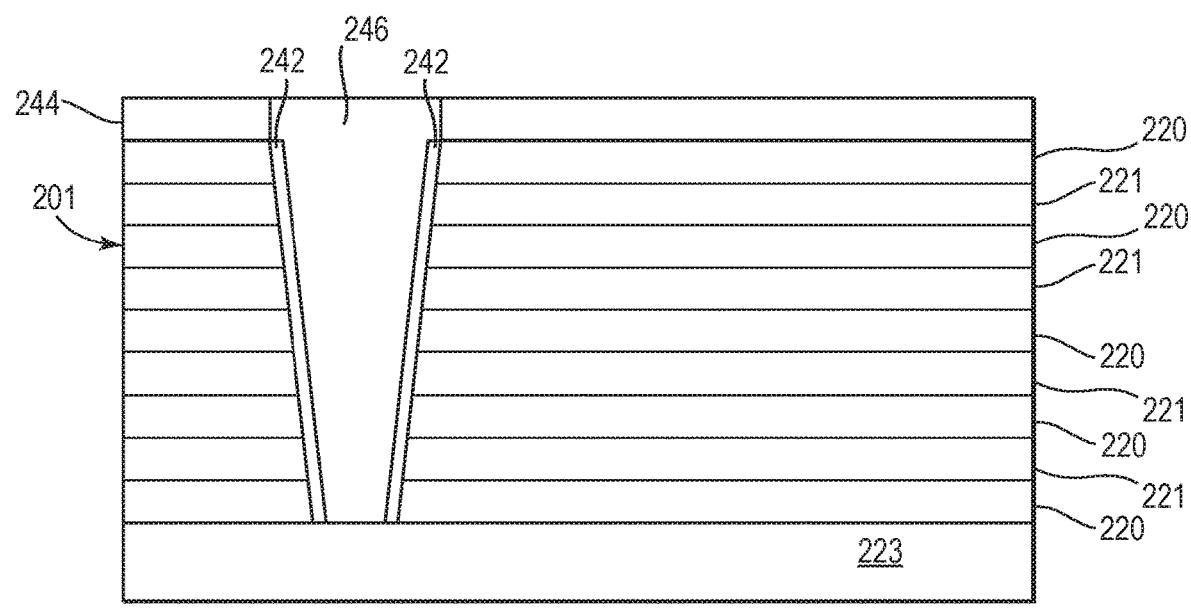
Figure 2I:
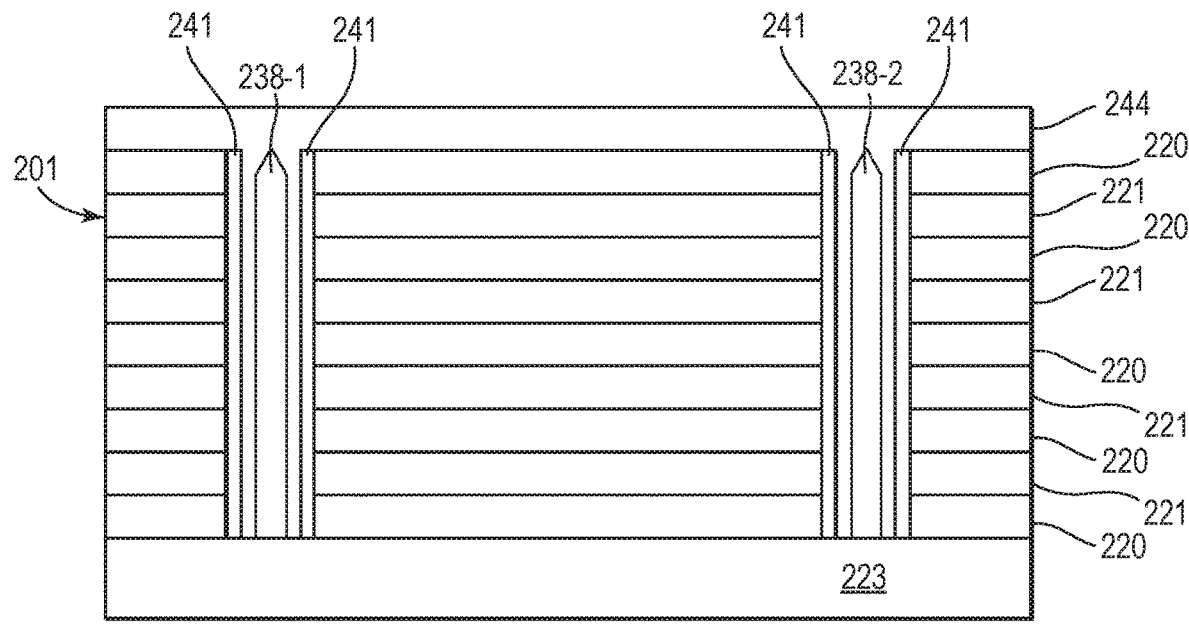

FIG. 2H is a cross-section corresponding to the cross-section in FIG. 2F at stage of processing following the stage of processing corresponding to FIG. 2F in accordance with a number of embodiments of the present disclosure. FIG. 2I is a cross-section corresponding to the cross-section in FIG. 2G at stage of processing following the stage of processing corresponding to FIG. 2G in accordance with a number of embodiments of the present disclosure.

Sacrificial material 244 can be removed from openings 240 to expose dielectric liners 242 while mask 245 covers closed openings 238. After sacrificial material 244 is removed from openings 240, mask 245 is removed to expose the remainder of sacrificial material 244. A dielectric 246 is then formed in openings 240 adjacent to the exposed dielectric liners 242, as shown in FIG. 2I for a representative dielectric liner 242. For example, dielectric 246 can be a photosensitive dielectric, such as a photosensitive oxide.

In some examples, dielectric 246 can overfill openings 240 and extend over the exposed sacrificial material 244. Dielectric 246 can then be removed from sacrificial material 244 so that an upper surface of sacrificial material 244 is exposed, as shown in FIGS. 2H and 2I, and so that upper surfaces of the remaining dielectrics 246 that overfill openings 240 are coplanar with the exposed upper surface of sacrificial material 244, as shown for a representative dielectric 246 in FIG. 2H. For example, dielectric 246 can be removed by polishing or by planarization, such as chemical mechanical planarization (CMP).

Figure 2J:
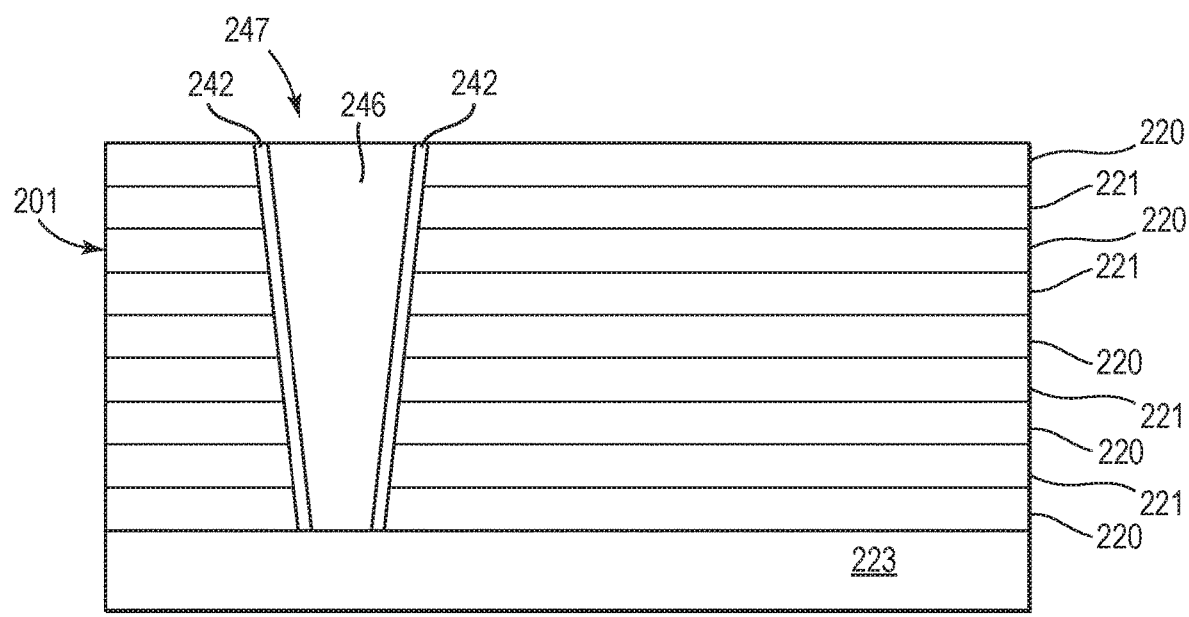
Figure 2K:
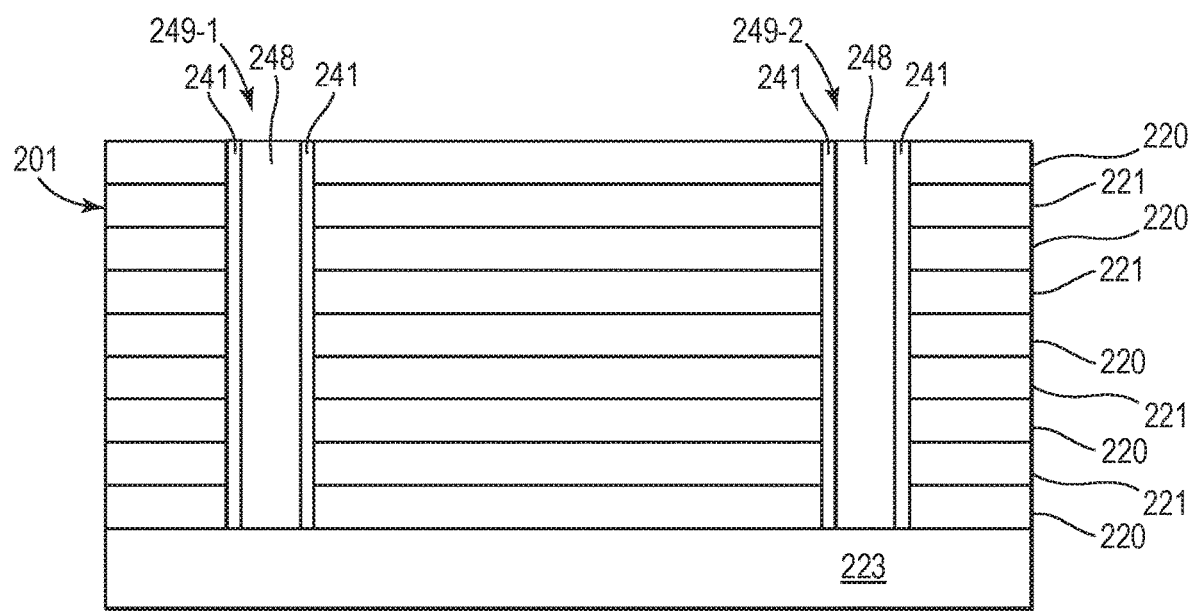

FIG. 2J is a cross-section corresponding to the cross-section in FIG. 2H at stage of processing following the stage of processing corresponding to FIG. 2H in accordance with a number of embodiments of the present disclosure. FIG. 2K is a cross-section corresponding to the cross-section in FIG. 2I at stage of processing following the stage of processing corresponding to FIG. 2I in accordance with a number of embodiments of the present disclosure.

In FIGS. 2J and 2K, sacrificial material 244 is removed so that an upper surface of the uppermost dielectric 220 is exposed. Moreover, dielectrics 246 can be planarized so that the upper surfaces of dielectrics are coplanar with the exposed upper surface of the uppermost dielectric 220, as shown in FIG. 2J for a representative dielectric 246. For example, dielectrics 246 can form termination structures 247, as shown in FIG. 2J for a representative termination structure 247. Sacrificial material 244 can also be removed from openings 238 to expose liners 241. Metal 248, such as tungsten, can then be formed in openings 238 adjacent to liners 241 to form sets of contacts 249, such as sets contacts 249-1 and 249-2, as shown in FIG. 2K.

Figure 2L:
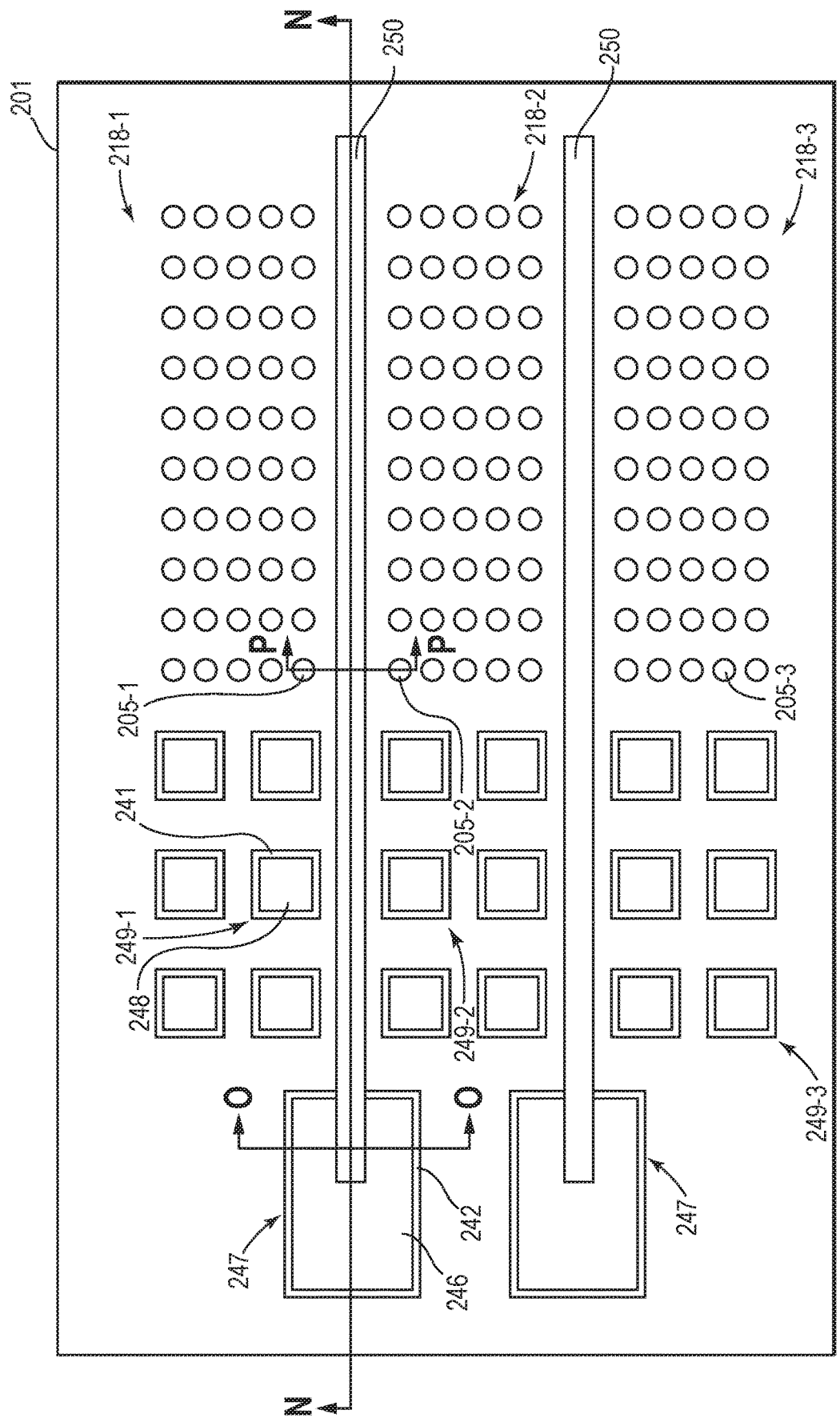
Figure 2N:
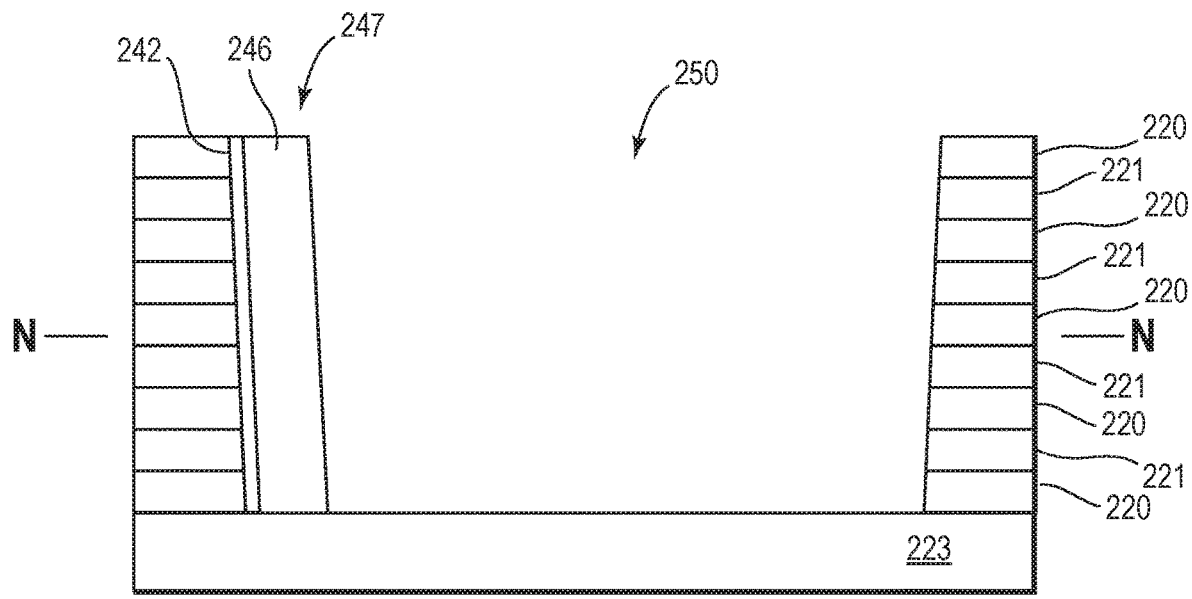
Figure 2O:
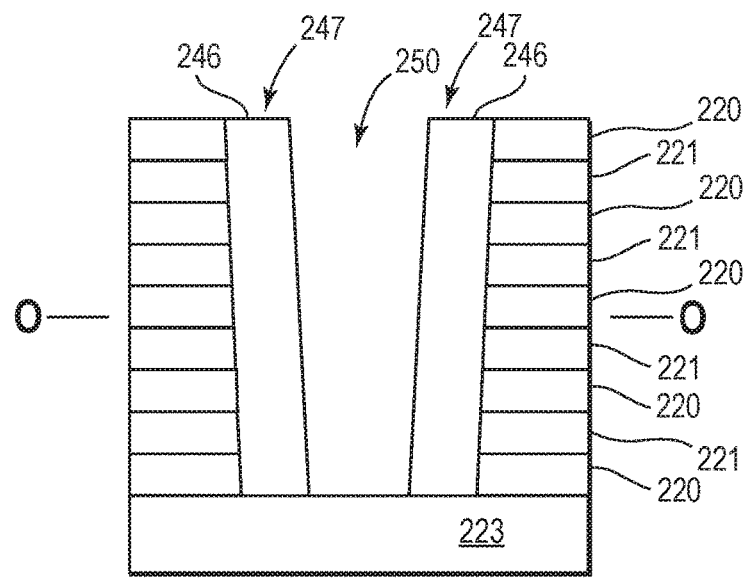

FIG. 2L is a top view corresponding to a stage of processing following the processing stage corresponding to FIGS. 2J and 2K in accordance with a number of embodiments of the present disclosure. FIG. 2M is a top view corresponding to a stage of processing following the processing stage corresponding to FIGS. 2J and 2K in accordance with a number of embodiments of the present disclosure. FIG. 2N is a cross-section viewed along line N-N in FIGS. 2L and 2M during the processing stages corresponding to FIGS. 2L and 2M in accordance with a number of embodiments of the present disclosure. FIG. 2O is a cross-section viewed along line O-O in FIGS. 2L and 2M during the processing stages corresponding to FIGS. 2L and 2M in accordance with a number of embodiments of the present disclosure.

In the example of FIG. 2L, two termination structures 247 that are separated from each other are shown. An opening 250, such as a slit or slot, is formed through one of the termination structures 247 and through stack 201 between the groups 218-1 and 218-2 of semiconductor structures and between the set of contacts 249-1 and the set of contacts 249-2, stopping at the upper surface of or in semiconductor 223, as shown in FIGS. 2L and 2N. Another opening 250 is formed through the other termination structure 247 and through stack 201 between the groups 218-2 and 218-3 of semiconductor structures and between the set of contacts 249-2 and the set of contacts 249-3.

In the example of FIG. 2M, a single termination structure is shown. An opening 250 is formed through a portion of the termination structure 247 and through stack 201 between the groups 218-1 and 218-2 of semiconductor structures and between the set of contacts 249-1 and the set of contacts 249-2, stopping at the upper surface of or in semiconductor 223, as shown in FIGS. 2M and 2N. Another opening 250 is formed through another portion of termination structure 247 and through stack 201 between the groups 218-2 and 218-3 of semiconductor structures and between the set of contacts 249-2 and the set of contacts 249-3.

Openings 250 terminate within termination structures 247. As shown in FIG. 2O, portions of a respective termination structure 247 are on either side of a portion of a respective opening 250. For example, the portions of the termination structure 247 line the portion of the respective opening 250.

Note that openings 250 are analogous to the segments 110 of opening 108 in FIG. 1, and the single opening 240 in FIG. 2B is analogous to segment 112-2 of opening 108. Forming the single opening 240 concurrently with forming contact openings 238 before forming contacts 249 and forming the termination structures 247 before forming openings 250 can reduce the amount of movement of the semiconductor structures 205 relative to the movement of the semiconductors 105 associated with forming segments 110 of opening 108 and segments 112-1 and 112-2 concurrently in a single step after forming the contacts. Moreover, forming openings 250 after forming termination structures 247 can avoid the difficulties associated with forming the T-intersections between segments 110 and segment 112-2 that occur when forming opening 108 during a single etch.

Figure 2P:
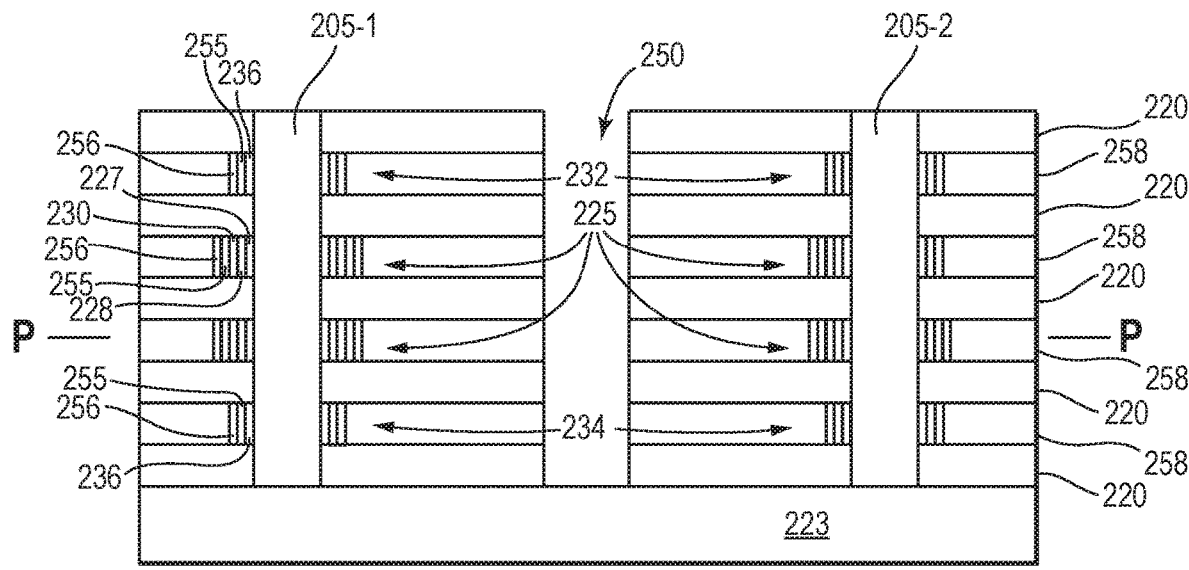

FIG. 2P is a cross-section viewed along line P-P in FIGS. 2L and 2M in accordance with a number of embodiments of the present disclosure. Openings 250 can provide access to dielectrics 221 for the removal of dielectrics 221. For example, dielectrics 221 can be removed as part of a replacement gate process. A removal material, such as a wet etchant, can be supplied through openings 250 to remove dielectrics 221 to form a stack of dielectrics 220 alternating with spaces (not shown) in the region that includes the groups 218 of semiconductors and in the region that includes the sets of contacts 249.

The respective termination structures 247 that terminate the respective openings in FIG. 2L can prevent the removal material from removing the dielectrics 221 from around the ends of the respective termination structures 247, which could provide a path for extraneous metal during a subsequent metal processing step. For example, the metal could cause an electrical short between access lines corresponding to group 218-1 and access lines corresponding to group 218-2 and between access lines corresponding to group 218-2 and access lines corresponding to group 218-3. Similarly, the single termination structure 247 in FIG. 2M can prevent the removal material from removing the dielectrics 221 and forming a path for extraneous metal that could cause an electrical short between access lines corresponding to group 218-1 and access lines corresponding to group 218-2 and between access lines corresponding to group 218-2 and access lines corresponding to group 218-3.

In some examples, a dielectric 255 can be supplied through openings 250 to form dielectric 255 in the spaces adjacent to gate dielectrics 236 and blocking dielectrics 230, as shown in FIG. 2P. For example, dielectric 261 can be high-dielectric-constant (high-K) dielectric, such as alumina ($Al_2O_3$), hafnia ($HfO_2$), zirconia ($ZrO_2$), praeseodymium oxide ($Pr_2O_3$), hafnium tantalum oxynitride (HfTaON), hafnium silicon oxynitride (HfSiON), or the like. An interface metallic 256 (e.g., a barrier metal), such as tantalum nitride (TaN), titanium nitride (TiN), or the like, can be supplied through openings 250 to form interface metallic 256 in the spaces adjacent to dielectric 255, as shown in FIG. 2P.

Metal 258, such as tungsten, can be supplied through openings 250 to form metal 258 in the spaces adjacent to interface metallic 256, as shown in FIG. 2P. For example, metal 258 can form lines, such as access lines that can include control gates of memory cells 225 and control lines that can include gates of select transistors 232 and 234. For example, metal 258 can be formed in the spaces as part of a replacement gate process. In some examples, dielectric 255, interface metallic 256, and metal 258 can wrap completely around the corresponding semiconductor structures 205. In examples that can include stair-step structures, the dielectric 221 can be removed from each step and replaced with metal 258 so that each step can include, for example, metal 258 over a dielectric 220.

In some examples, memory cells 225 can form groups of series-coupled memory cells (e.g., a NAND strings) adjacent to semiconductor structures 205 and coupled in series with select transistors 232 and 234. Semiconductor 223 can be a source that can be selectively coupled to a group of series-coupled memory cells by a select transistor 234. A data line (not shown) can be coupled to an end of a semiconductor structure 205 opposite to semiconductor 223. For example, a select transistor 232 can selectively couple the data line to the group of series-coupled memory cells. The memory cells adjacent to semiconductor structures 205-1 can form a block of memory cells; the memory cells adjacent to semiconductor structures 205-2 can form a block of memory cells; and the memory cells adjacent to semiconductor structures 205-2 can form a block of memory cells. Extraneous metal 258 can be subsequently removed from openings 250 and a dielectric (not shown) can be formed in openings to electrically isolate adjacent blocks from each other.

The separated termination structures 247 in the example of FIG. 2L and segments between separated termination structures 247 are coupled to the regions that include contacts 249 and the semiconductor structures 205. The couplings can restrict movement of the semiconductor structures 205 that could occur while metal 258 is being formed in the spaces. For example, the coupling can reduce the movement of the semiconductor structures relative to the movement of the semiconductor structures associated with transverse segments 112-1 and 112-2 in FIG. 1. In some examples, the restricted movement of the semiconductor structures 205 can reduce the difficulties of aligning the data line contacts with the semiconductor structures associated with transverse segments 112-1 and 112-2. This can result in fewer "dummy" memory cells relative to the approach described in conjunction with FIG. 1, thus increasing the number of memory cells available to store data.

Figure 3A:
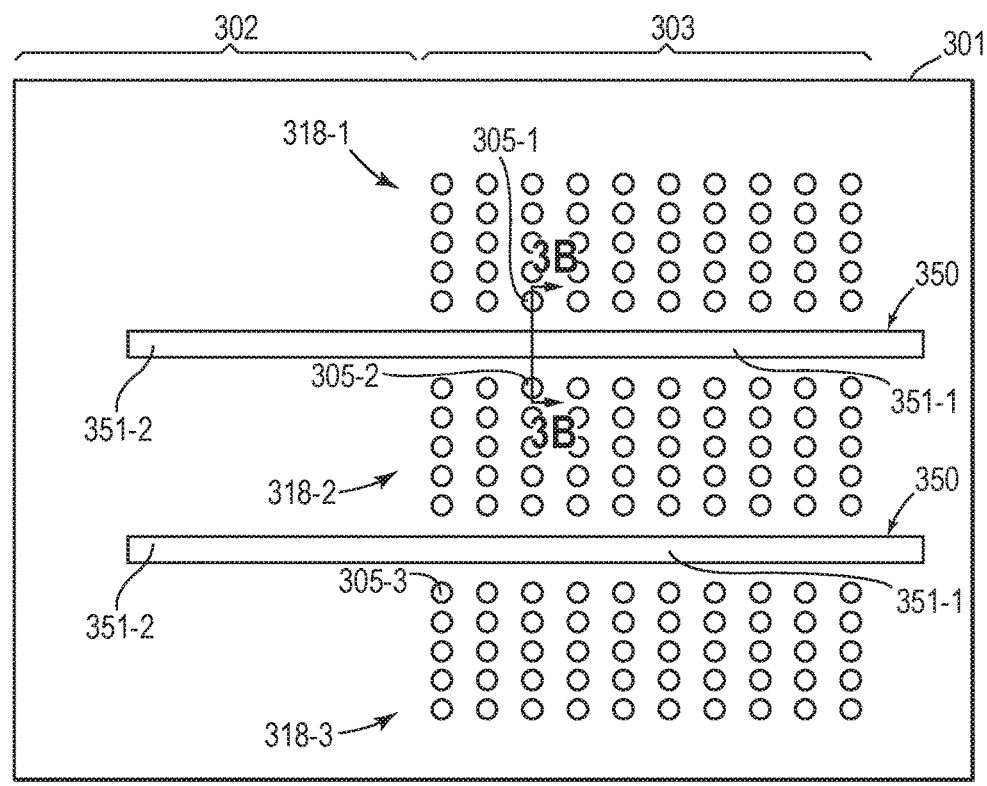
FIGS. 3A-3F are various views corresponding to particular stages of processing associated with forming a stacked memory array in accordance with a number of embodiments of the present disclosure.
Figure 3B:
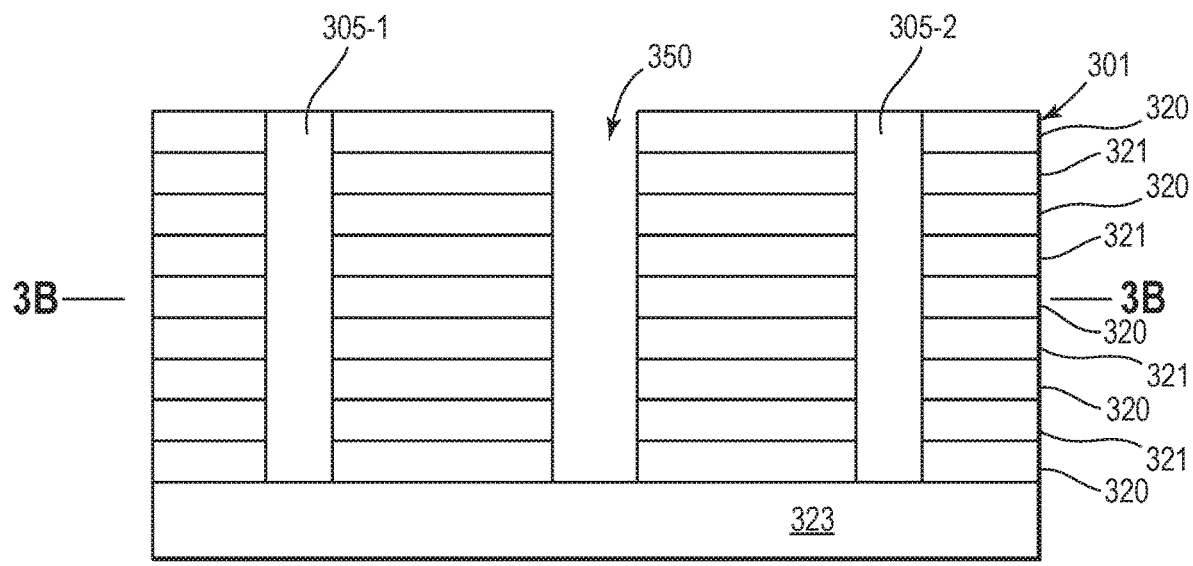

FIG. 3A is a top view corresponding to a particular stage of processing associated with forming a stacked memory array in accordance with a number of embodiments of the present disclosure. FIG. 3B is a cross-section viewed along line 3B-3B in FIG. 3A during the processing stage corresponding FIG. 3A in accordance with a number of embodiments of the present disclosure.

In the example of FIGS. 3A and 3B, groups 318-1 to 318-3 of respective semiconductor structures 305-1 to 305-3 pass through a stack 301 of alternating dielectrics 320 and 321 formed over a semiconductor 323. In some examples, memory cells and select transistors can be partially formed adjacent to each semiconductor structure 305 at levels having dielectrics 321, as described previously in conjunction with FIG. 2E. Semiconductor structures 305, dielectrics 320, dielectrics 321, and semiconductor 323 can be as described previously for semiconductor structures 205, dielectrics 220, dielectrics 221, and semiconductor 223, respectively. In some examples, stack 301 can include a stair-step structure at one or both ends of the structures in FIG. 3A so that each stair (e.g., step) in the stair-step structure can include a dielectric 321 over an adjacent dielectric 320, for example.

During the processing stage corresponding to FIGS. 3A and 3B, openings 350, such as slots or slits, are formed through stack 301, stopping at an upper surface of or in semiconductor 323. Each opening 350 has a segment 351-1 in a region 303 of stack 301 that includes the groups 318-1 to 318-3 of semiconductor structures and a segment 351-2 in a region 302 of stack 301 that does not include the groups 318-1 to 318-3 of semiconductor structures. For example, region 303 can be referred to a memory-cell region, in that memory cells are to be formed in region 303, and region 302 can be referred to as a non-memory-cell region. A segment 351-1 can be formed between groups 318-1 and 318-2, and a segment 351-1 can be formed between groups 318-2 and 318-3.

Note that openings 350 are analogous to the segments 110 of opening 108 in FIG. 1. However, the processing stage corresponding to FIG. 3A eliminates the formation of segments 112-1 and 112-2 and thus mitigates the problems associated with the formation of segments 112-1 and 112-2.

Figure 3C:
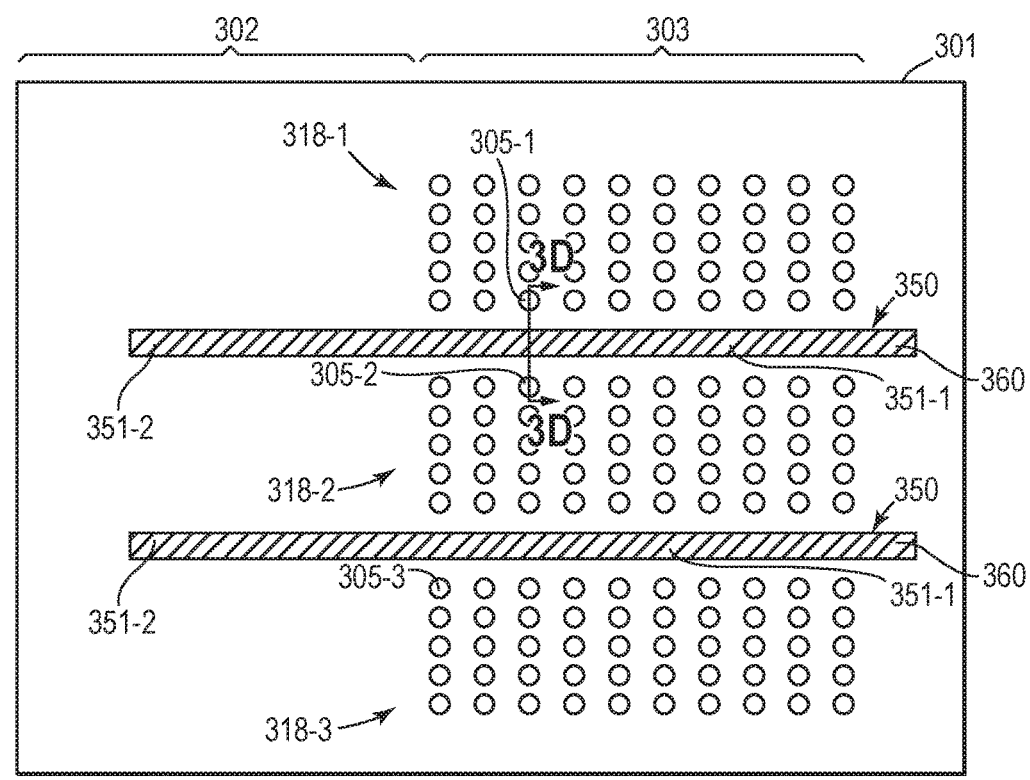
Figure 3D:
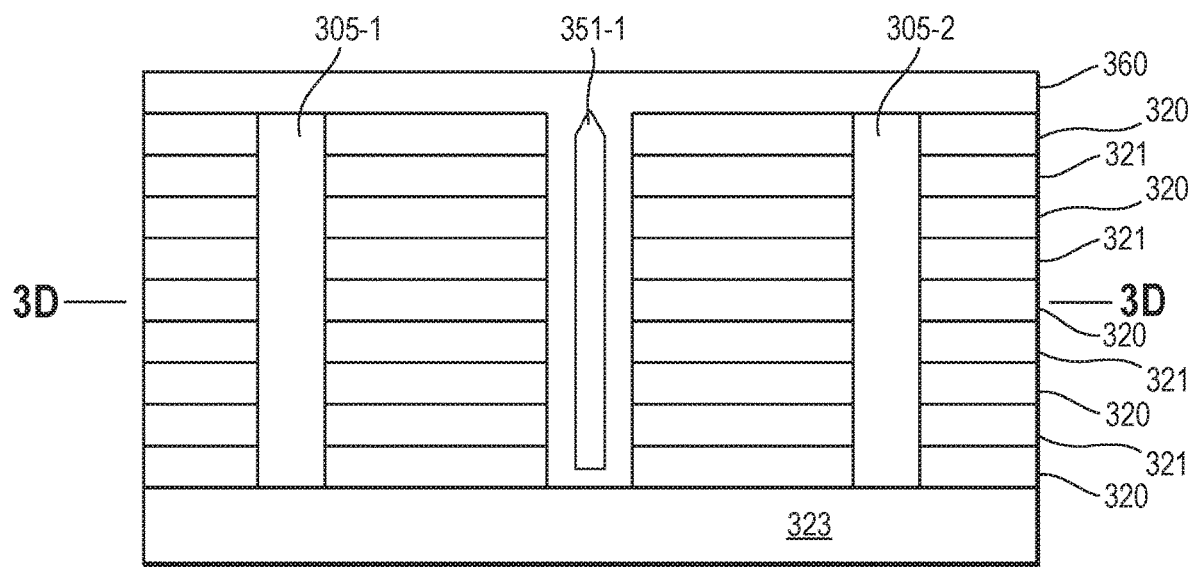

FIG. 3C is a top view corresponding to a stage of processing following the processing stage corresponding to FIG. 3A in accordance with a number of embodiments of the present disclosure. FIG. 3D is a cross-section viewed along line 3D-3D in FIG. 3C during the processing stage corresponding to FIG. 3C and along line 3D-3D in FIG. 3E during the processing stage corresponding to FIG. 3E in accordance with a number of embodiments of the present disclosure.

A sacrificial material 360 is formed over the uppermost dielectric 320 and closes off openings 350 along their entire length adjacent to the tops of openings 350. For example, sacrificial material 360 closes off segments 351-1 and 351-2. For example, sacrificial material 360 pinches off adjacent to the tops of openings 350 before completely filling openings 350, as shown in FIG. 3D. In some examples, sacrificial material 360 can be a dielectric, such as aluminum oxide.

Figure 3E:
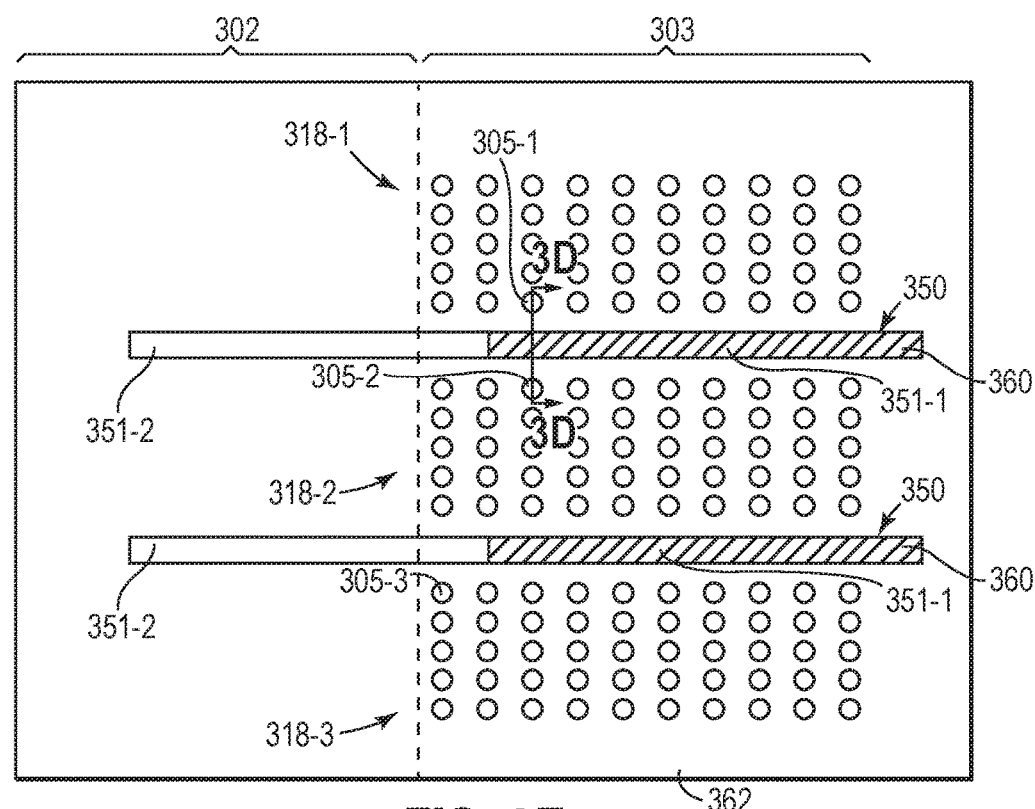

FIG. 3E is a top view corresponding to a stage of processing following the processing stage corresponding to FIG. 3C. A mask 362 (e.g., of photoresist) is formed over stack 301 in FIG. 3E. Mask 362 is patterned to expose region 302 and closed segments 351-2, leaving region 303 and closed segments 351-1 covered. The exposed closed segments 351-2 are then opened by removing sacrificial material 360 from closed segments 351-2, while mask 362 prevents sacrificial material 360 from being removed from closed segments 351-1, as shown in FIG. 3E. For example, the sacrificial material 360 in closed segment 351-1 may remain as shown in FIG. 3D. In some instances, sacrificial material 360 can be removed from portions of closed segments 351-1 adjacent to segments 351-2 and the edge of mask 362, as shown in FIG. 3E. In some examples, sacrificial material 360 can be removed using a Standard Clean 1 (SC1) that can include applying a solution of ammonium hydroxide (NH$_4$OH), hydrogen peroxide, (H$_2$O$_2$), and water to sacrificial material 360.

Figure 3F:
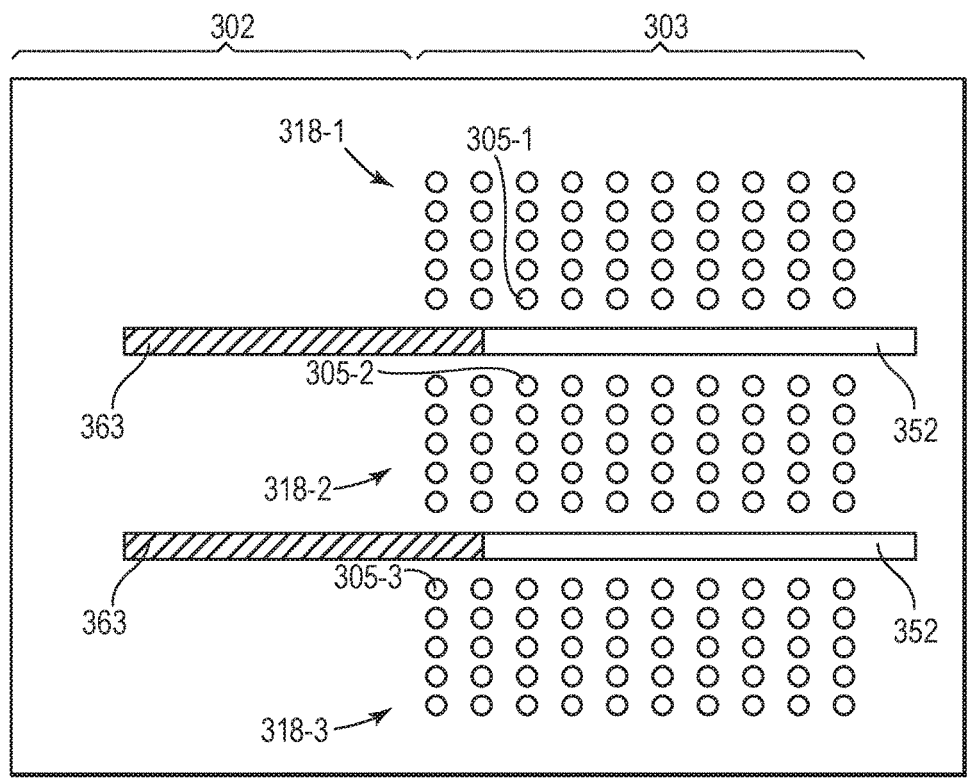

FIG. 3F is a top view corresponding to a stage of processing following the processing stage corresponding to FIG. 3E. In FIG. 3F, a dielectric 363, such as oxide, can be formed in opened segments 351-2. For example, dielectric 363 can overfill opened segment 351-2 and can extend over the uppermost dielectric 320 in region 302 and over sacrificial material 360 in region 303. In some instances, dielectric 363 can extend into the portions of closed segments 351-1 from which the sacrificial material 360 was removed, as shown in FIG. 3F. For example, dielectrics 363 can be referred to termination structures.

In some examples, the dielectric 363 that can extend over the uppermost dielectric 320 in region 302 and over sacrificial material 360 in region 303 can be removed by CMP to expose sacrificial material 360. Subsequently, sacrificial material 360 can be removed from closed segments 351-1 using the SC1 clean to form an opening 352 in region 303 between groups 318-1 and 318-2 and an opening 352 in region 303 between groups 318-2 and 318-3. Note that openings 352 terminate at dielectrics 363. As such, dielectrics 363 can be referred to as termination structures.

In some examples, dielectrics 321 can be removed by accessing them through openings 352 to form spaces in a manner similar to that described previously in conjunction with FIG. 2P. Metal can be formed in the spaces by supplying the metal through openings 352 in a manner similar to that described previously in conjunction with FIG. 2P. The metal can form control lines coupled to select transistors adjacent to semiconductor structures 305 and access lines coupled to memory cells adjacent to semiconductor structures 305. In examples that can include stair-step structures, the dielectric 321 can be removed from each step and replaced with metal so that each step can include, for example, metal over a dielectric 320.

Dielectrics 363 can prevent the removal material from removing the dielectrics 321 from around the ends of the respective dielectrics 363, which could provide a path for extraneous metal during the metal processing step. For example, the metal could cause an electrical short between access lines corresponding to group 318-1 and access lines corresponding to group 318-2 and between access lines corresponding to group 318-2 and access lines corresponding to group 318-3.

Figure 4A:
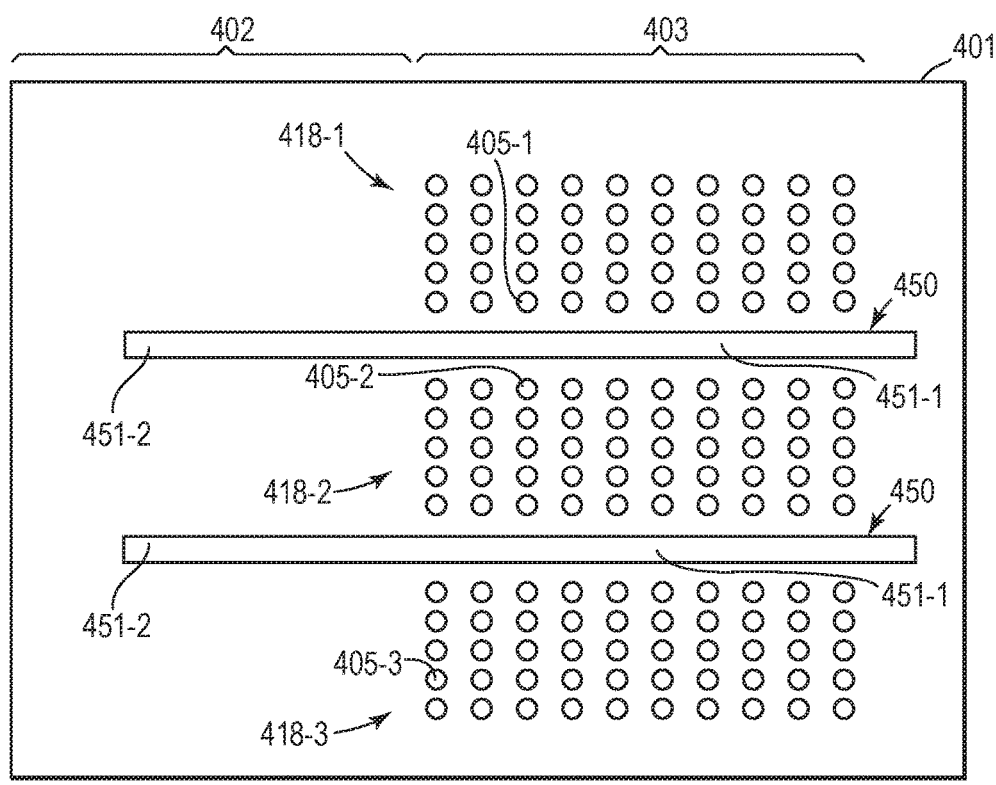
FIGS. 4A-4F are various views corresponding to particular stages of processing associated with forming a stacked memory array in accordance with a number of embodiments of the present disclosure.
Figure 4B:
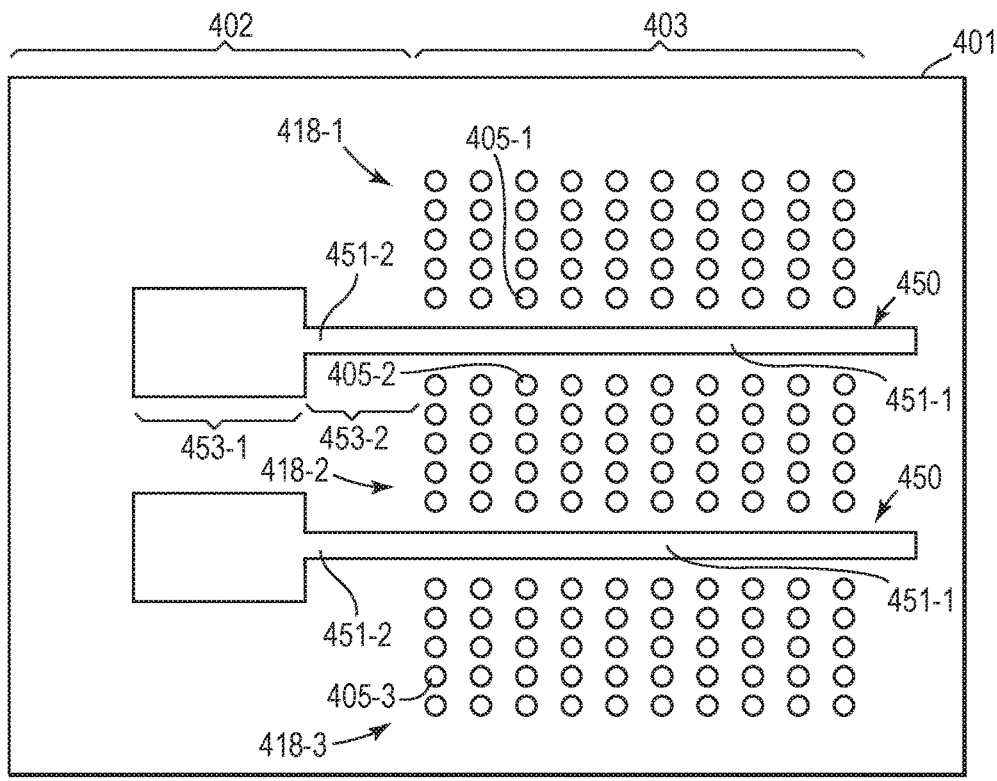

FIG. 4A is a top view corresponding to a particular stage of processing associated with forming a stacked memory array in accordance with a number of embodiments of the present disclosure. FIG. 4B is a top view corresponding to a particular stage of processing associated with forming a stacked memory array in accordance with a number of embodiments of the present disclosure.

In the example of FIGS. 4A and 4B, groups 418-1 to 418-3 of respective semiconductor structures 405-1 to 405-3 pass through a stack 401 of alternating dielectrics formed over a semiconductor. For example, stack 401 can be similar to (e.g., the same as) stack 301, as shown in FIG. 3B. For example, stack 401 can have the alternating dielectrics 320 and 321. In some examples, memory cells and select transistors can be partially formed adjacent to each semiconductor structure 405 at levels having dielectrics 321, as described previously in conjunction with FIG. 2E.

During the processing stage corresponding to FIGS. 4A and 4B, openings 450 are formed through stack 401 in a manner similar to forming opening 350 through stack 301, as shown in FIG. 3B. Each of openings 450 has a segment 451-1 in a region 403 of stack 401 that includes the groups 418-1 to 418-3 of semiconductor structures and a segment 451-2 in a region 402 of stack 401 that does not include the groups 418-1 to 418-3 of semiconductor structures. For example, region 403 can be referred to a memory-cell region, in that memory cells are to be formed in region 403, and region 402 can be referred to as a non-memory-cell region.

A segment 451-1 can be formed between groups 418-1 and 418-2, and a segment 451-1 can be formed between groups 418-2 and 418-3. In FIG. 4B, segments 451-2 include a portion 453-1 and a portion 453-2 between portion 453-1 and segments 451-1. For example, portion 453-1 is wider than portion 453-2 in a direction transverse to portion 453-2.

Note that openings 450 are analogous to the segments 110 of opening 108 in FIG. 1. However, the processing stage corresponding to FIGS. 4A and 4B eliminates the formation of segments 112-1 and 112-2 and thus mitigates the problems associated with the formation of segments 112-1 and 112-2.

Figure 4C:
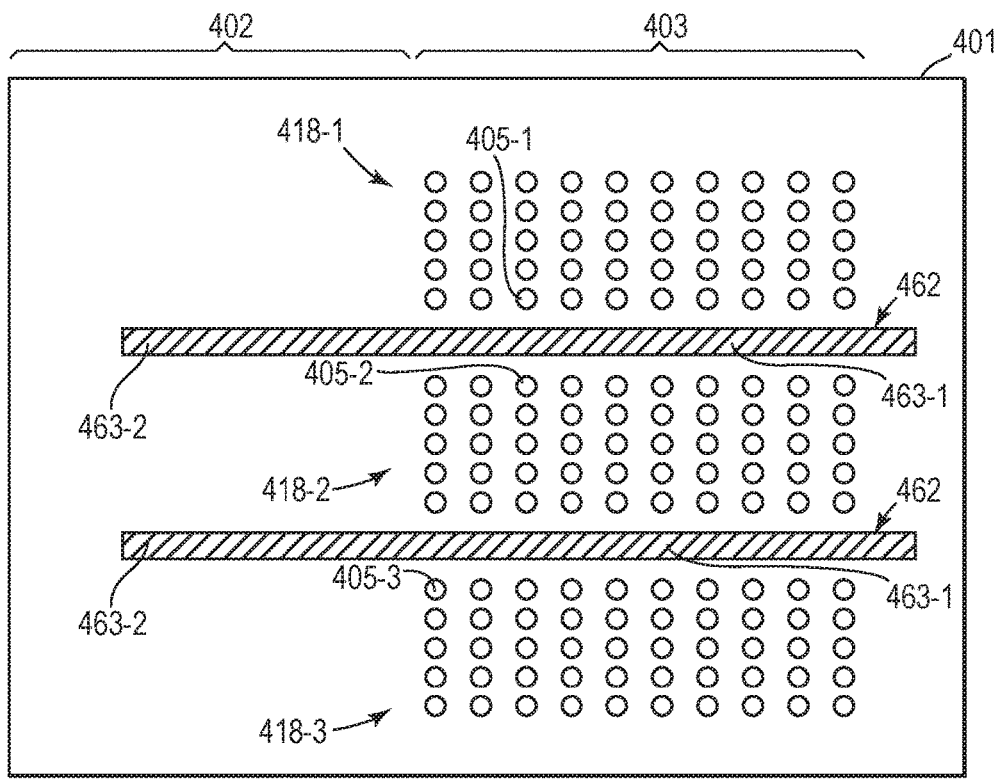
Figure 4D:
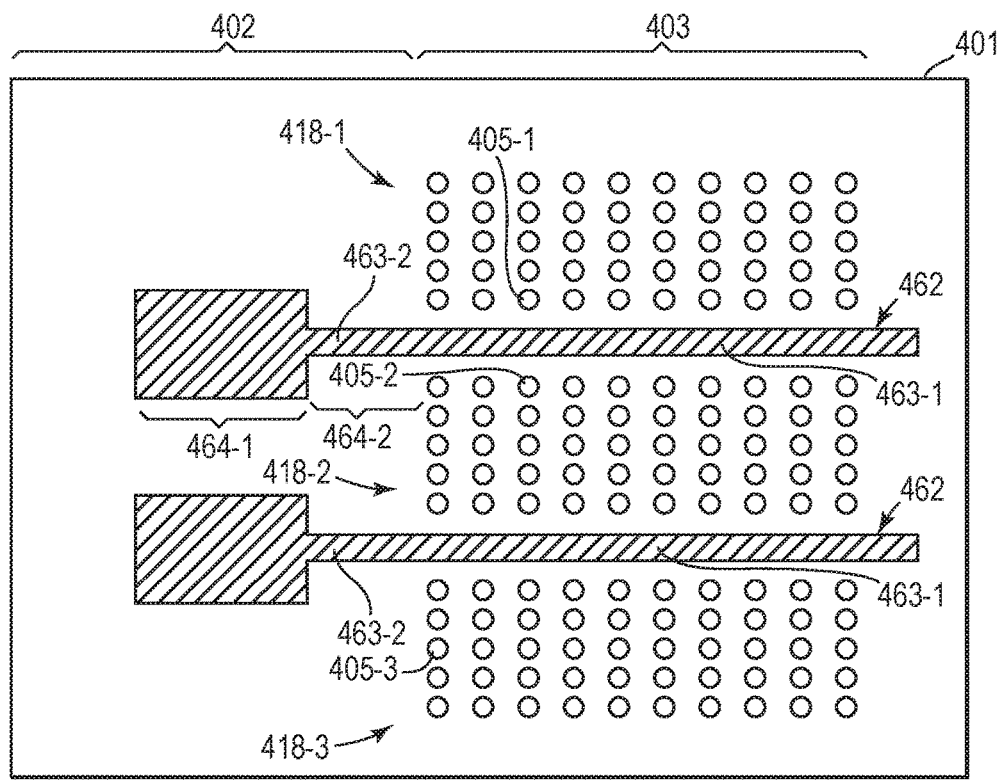

FIG. 4C is a top view corresponding to a stage of processing following the processing stage corresponding to FIG. 4A in accordance with a number of embodiments of the present disclosure. FIG. 4D is a top view corresponding to a stage of processing following the processing stage corresponding to FIG. 4B in accordance with a number of embodiments of the present disclosure.

A photosensitive material 462 is formed in openings 450 in FIGS. 4C and 4D along the entire lengths of openings 450, including segments 451-1 and 451-2. Photosensitive material 462 can be a photosensitive dielectric, such as a photosensitive spin-on dielectric. Photosensitive material 462 can be oxide for example.

Photosensitive material 462 can include segments 463-1 in region 403 that correspond to segments 451-1 of openings 450 and segments 463-2 in region 402 that correspond to segments 451-2 of openings 450. For example, a segment 463-1 can be between groups 418-1 and 418-2, and a segment 463-1 can be between groups 418-2 and 418-3. As shown in FIG. 4D, a segment 463-2 can have a portion 464-1, corresponding to portion 453-1 of segment 451-2, and a portion 464-2, corresponding to portion 453-2 of segment 451-2, between portion 464-1 and segment 463-1. Portion 464-1 can be wider than portion 464-1 in a direction transverse to portion 464-2.

Figure 4E:
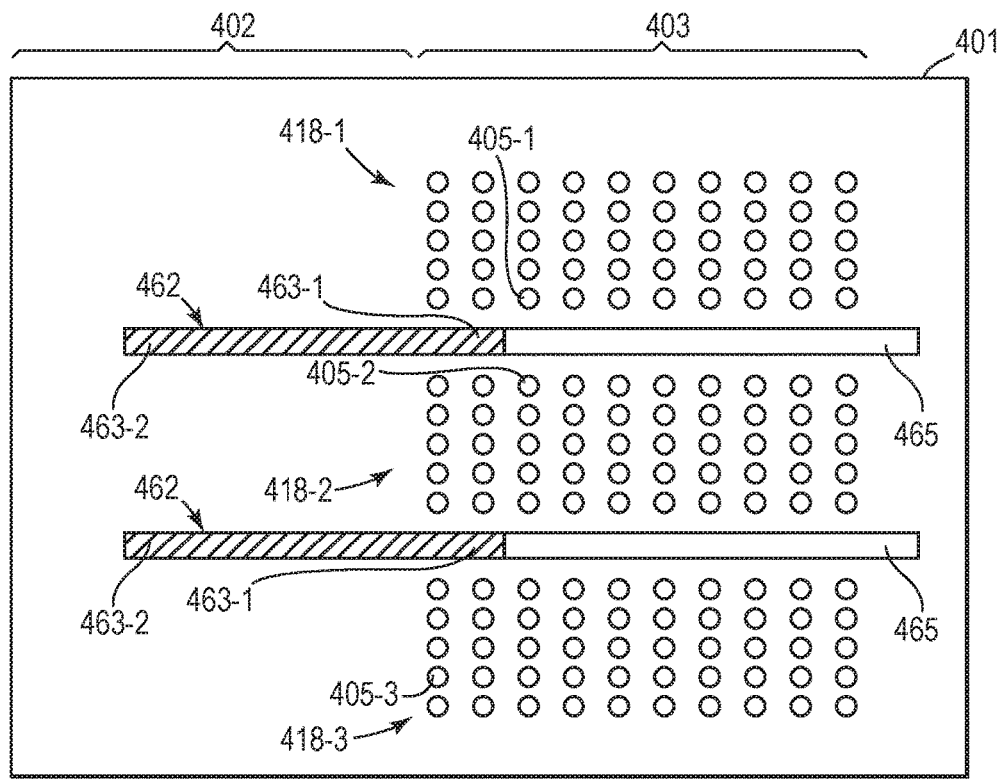
Figure 4F:
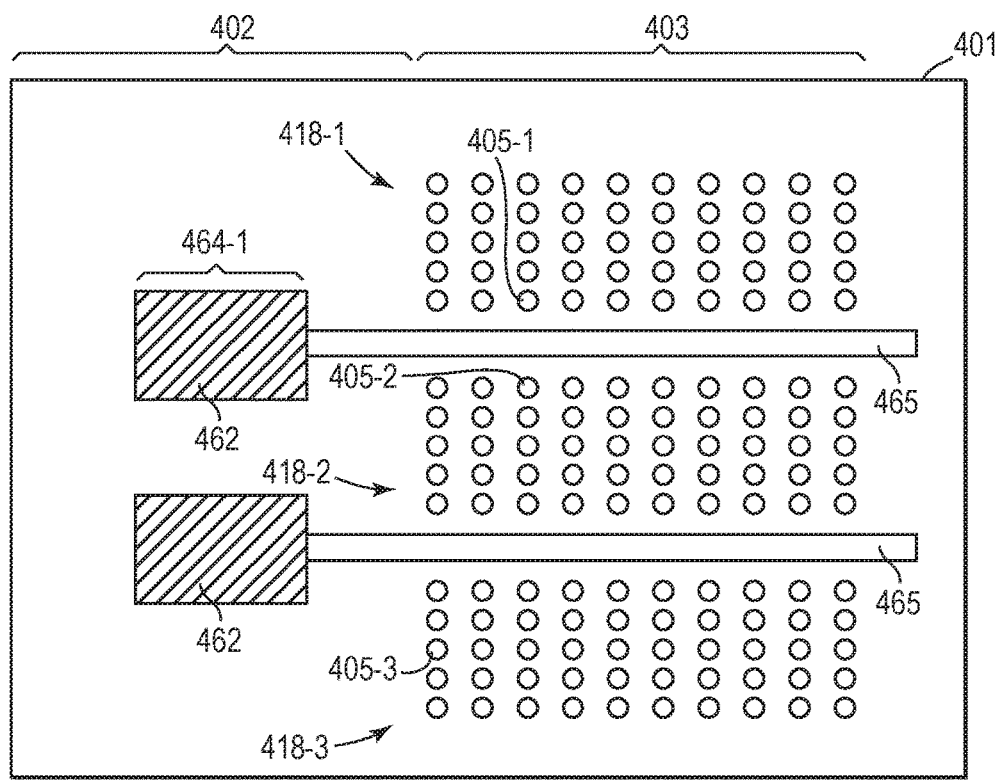

FIG. 4E is a top view corresponding to a stage of processing following the processing stage corresponding to FIG. 4C in accordance with a number of embodiments of the present disclosure. FIG. 4F is a top view corresponding to a stage of processing following the processing stage corresponding to FIG. 4D in accordance with a number of embodiments of the present disclosure.

In FIGS. 4E and 4F, segments 463-1 of photosensitive material 462 are removed to form openings 465 in region 403, leaving photosensitive material 462 in region 402 so that openings terminate at the photosensitive material 462. An opening 465 can be between semiconductor structures 418-1 and 418-2, and an opening 465 can be between semiconductor structures 418-2 and 418-3.

In the example of FIG. 4E, segments 463-2 of photosensitive material 462 are left. In some examples, portions of segments 463-1 photosensitive material 462 can be left between semiconductor structures 418-1 and 418-2 and between semiconductor structures 418-2 and 418-3 adjacent to segments 463-2 so that openings 465 terminate at the portions of segments 463-1, as shown in FIG. 4E. For example, segments 463-2 can be referred to as termination structures. In the example of FIG. 4F, portions 464-2 of segments 463-2 are removed to form additional portions of openings 465 in region 402, leaving portions 464-1 of segments 463-2 so that openings 465 terminate at portions 464-1. For example, portions 464-1 can be referred to as termination structures.

In some examples, photosensitive material 462 can be a negative photosensitive material. For example, the photosensitive material 462 in FIGS. 4C and 4D that is to remain can be exposed to electromagnetic radiation, such as light, and the photosensitive material 462 in FIGS. 4C and 4D that is to be removed can be left unexposed. The unexposed photosensitive material 462 can then be removed, such as by etching.

In other examples, photosensitive material 462 can be a positive photosensitive material. For example, the photosensitive material 462 in FIGS. 4C and 4D that is to be removed can be exposed to electromagnetic radiation, and the photosensitive material 462 in FIGS. 4C and 4D that is to remain can be left unexposed. The exposed photosensitive material 462 can then be removed, such as by etching.

In some examples, openings 450 can be overfilled with photosensitive material 462 so that photosensitive material 462 extends over the uppermost dielectric 420. For example, photosensitive material 462 over the uppermost dielectric 420 that remains over the uppermost dielectric 420 after the formation of the structures in FIGS. 4E and 4F can be removed by CMP to expose the uppermost dielectric 420.

In some examples, dielectrics in stack 401, such as dielectrics corresponding to the dielectrics 321 in stack 301 in FIG. 3B can be removed by accessing them through openings 465 to form spaces in a manner similar to that described previously in conjunction with FIG. 2P. Metal can be formed in the spaces by supplying the metal through opening 465 in a manner similar to that described previously in conjunction with FIG. 2P. The metal can form control lines coupled to select transistors adjacent to semiconductor structures 405 and access lines coupled to memory cells adjacent to semiconductor structures 405.

The termination structures can prevent removal material from removing the dielectrics from around the ends of the respective termination structures, which could provide a path for extraneous metal during the metal processing step. For example, the metal could cause an electrical short between access lines corresponding to group 418-1 and access lines corresponding to group 418-2 and between access lines corresponding to group 418-2 and access lines corresponding to group 418-3.

Figure 5A:
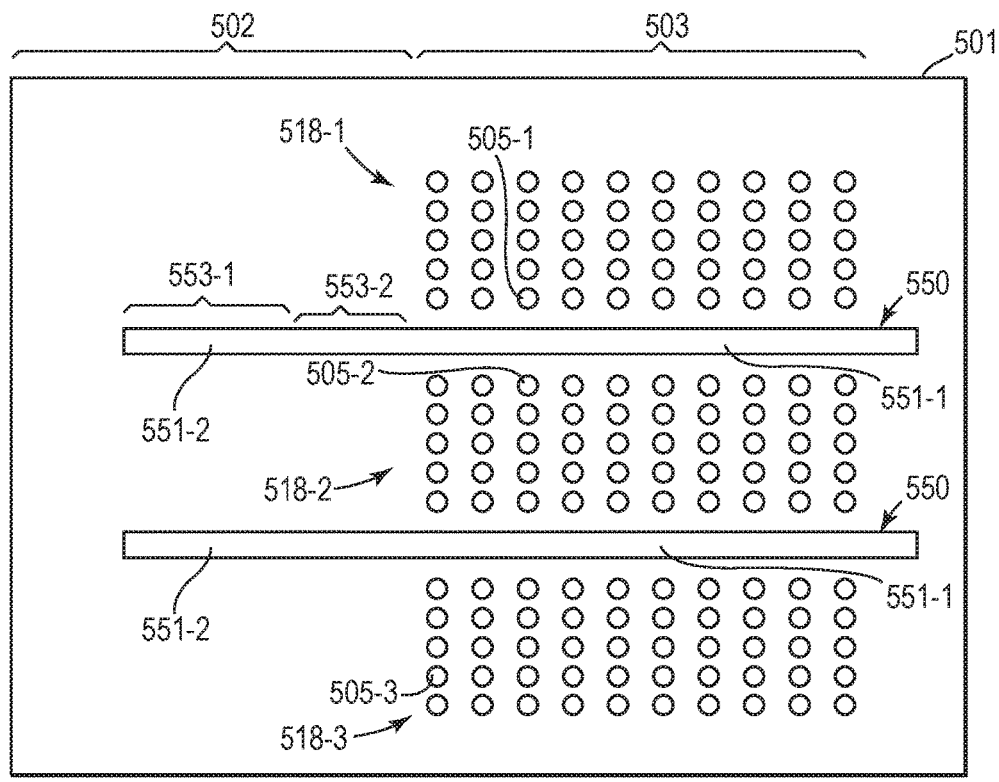
FIGS. 5A-5H are various views corresponding to particular stages of processing associated with forming a stacked memory array in accordance with a number of embodiments of the present disclosure.
Figure 5B:
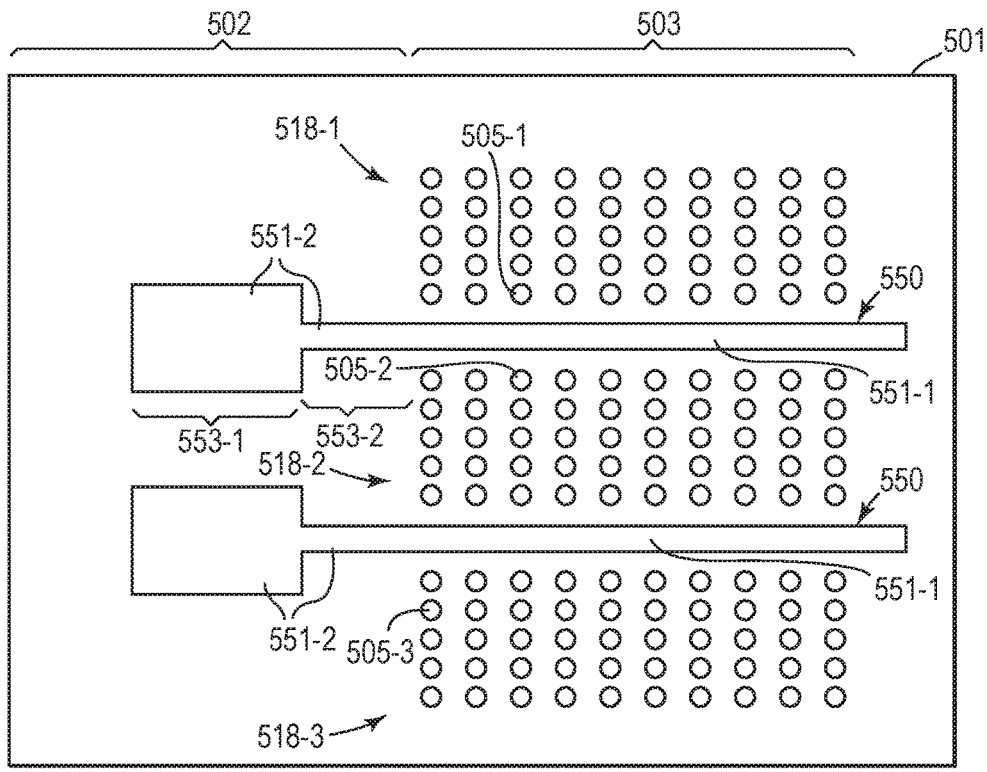

FIG. 5A is a top view corresponding to a particular stage of processing associated with forming a stacked memory array in accordance with a number of embodiments of the present disclosure. FIG. 5B is a top view corresponding to a particular stage of processing associated with forming a stacked memory array in accordance with a number of embodiments of the present disclosure.

In the example of FIGS. 5A and 5B, groups 518-1 to 518-3 of respective semiconductor structures 505-1 to 505-3 pass through a stack 501 of alternating dielectrics formed over a semiconductor. For example, stack 501 can be similar to stack 301 in FIG. 3B. In some examples, memory cells and select transistors can be partially formed adjacent to each semiconductor structure 505, as described previously in conjunction with FIG. 2E. Semiconductor structures 505 can be as described previously for semiconductor structures 205.

During the processing stage corresponding to FIGS. 5A and 5B, openings 550 are formed through stack 501 in a manner similar to forming opening 350 through stack 301, as shown in FIG. 3B. Each of openings 550 has a segment 551-1 in a region 503 of stack 501 that includes the groups 518-1 to 518-3 of semiconductor structures and a segment 551-2 in a region 502 of stack 501 that does not include the groups 518-1 to 518-3 of semiconductor structures. For example, region 503 can be referred to a memory-cell region, in that memory cells are to be formed in region 503, and region 502 can be referred to as a non-memory-cell region.

A segment 551-1 can be between groups 518-1 and 518-2, and a segment 551-1 can be between groups 518-2 and 518-3. Each segment 551-2 can include a portion 553-1 and a portion 553-2 between portion 553-1 and a segment 551-1. For example, in FIG. 5B portion 553-1 is wider than portion 553-2 in a direction transverse to portion 553-2.

Note that openings 550 are analogous to the segments 110 of opening 108 in FIG. 1. However, the processing stage corresponding to FIGS. 5A and 5B eliminates the formation of segments 112-1 and 112-2 and thus mitigates the problems associated with the formation of segments 112-1 and 112-2.

Figure 5C:
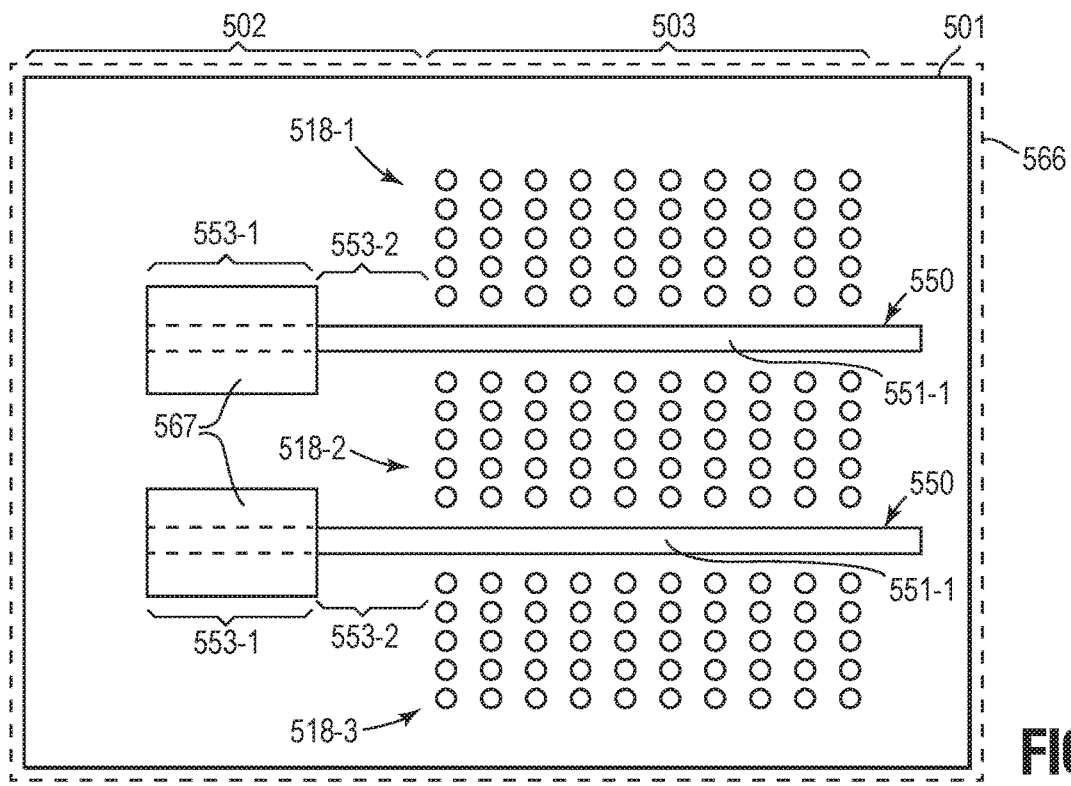
Figure 5D:
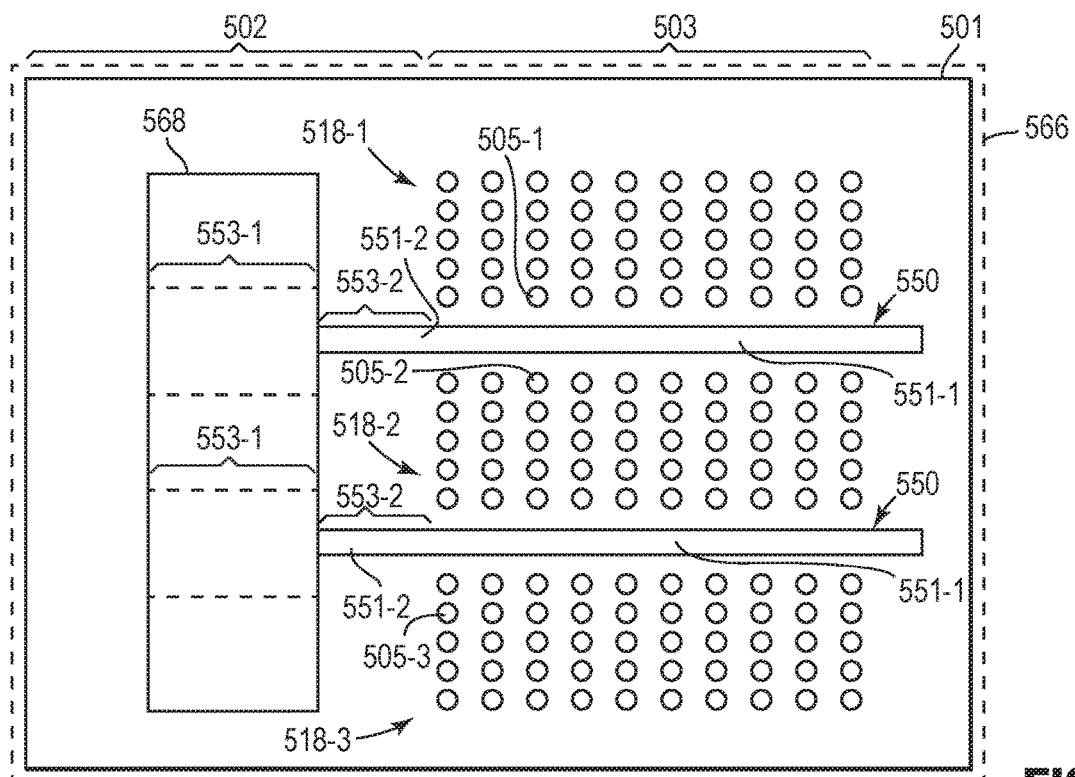

FIG. 5C is a top view corresponding to a stage of processing following the stage of processing corresponding to FIG. 5A in accordance with a number of embodiments of the present disclosure. FIG. 5D is a top view corresponding to a stage of processing following the stage of processing corresponding to FIG. 5B in accordance with a number of embodiments of the present disclosure.

In FIGS. 5C and 5D, a material 566, such as a barrier material, is blanket deposited respectively over the structures of FIGS. 5A and 5B to cover the upper surfaces of stacks 501 and fill openings 550. For example, material 566 can overfill openings 550 and extend over an upper surface of the uppermost dielectric in stack 501. In some examples, material 566 can be polysilicon, polysilicon and oxide, or nitride and oxide.

In FIG. 5C, material 566 in region 502 is covered with mask elements 567 so that filled portions 553-1 of filled segments 551-2 of filled openings 550 are covered, leaving the remainder of material 566 uncovered. For example, filled segments 551-1 of filled openings 550 can be left uncovered, as can a portion of material 566 between mask elements 567. In some examples, material 566 in filled portions 553-2 of filled segments 551-2 between mask elements 567 and filled segments 551-1 can be left uncovered. In FIG. 5C, material 566 uncovered by mask elements 567 is removed, leaving the material 566 covered by mask elements 567.

In FIG. 5D, material 566 in region 502 is covered with a single mask 568, leaving the remainder of material 566 uncovered. For example, material 566 in region 503 and material 566 in region 502 between mask 568 and region 503 can be left uncovered. Mask 568 can cover both filled portions 553-1 of filled segments 551-2, leaving filled portions 553-2 of filled segments 551-2 and filled segments 551-1 uncovered. In FIG. 5D, material 566 uncovered by mask 568 is removed, leaving the material 566 covered by mask 568.

Figure 5E:
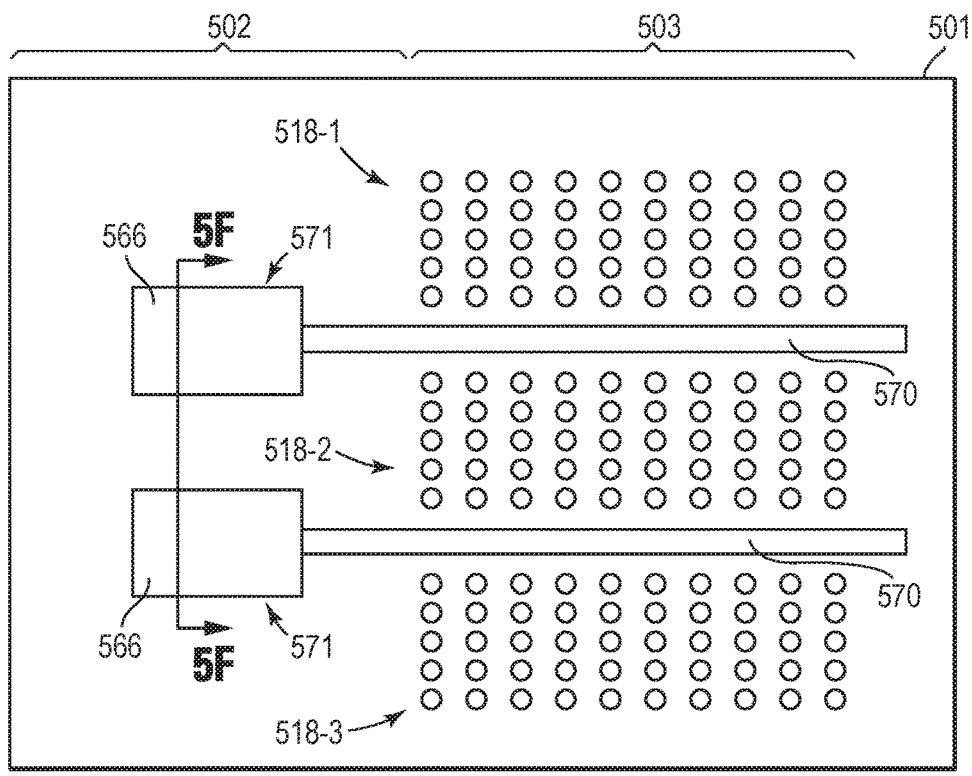
Figure 5F:
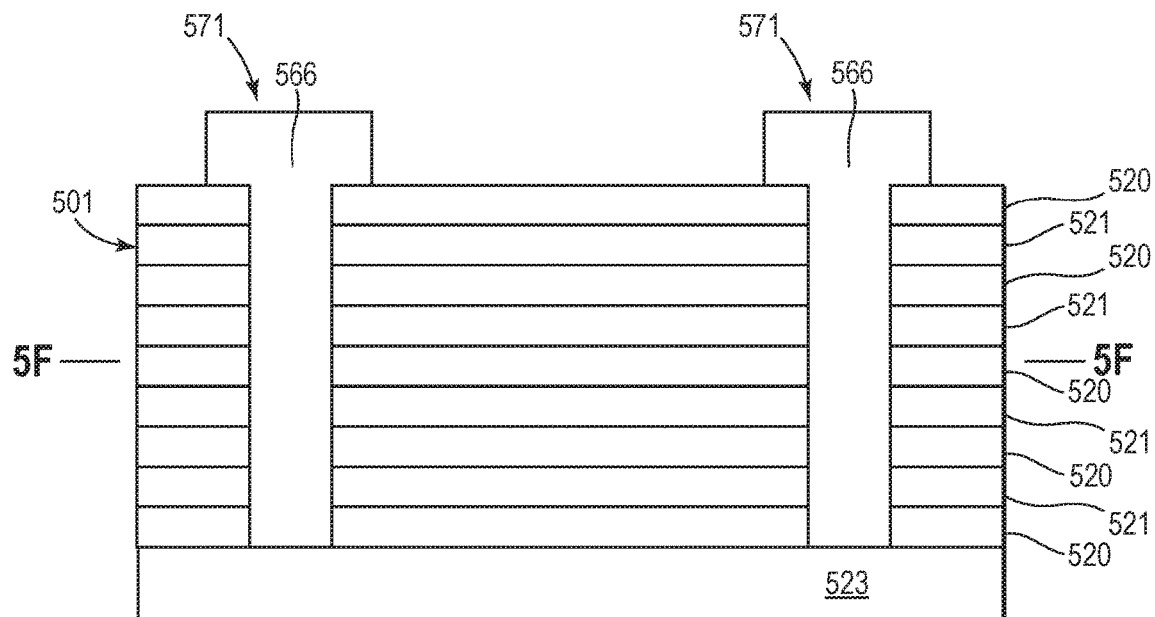
Figure 5G:
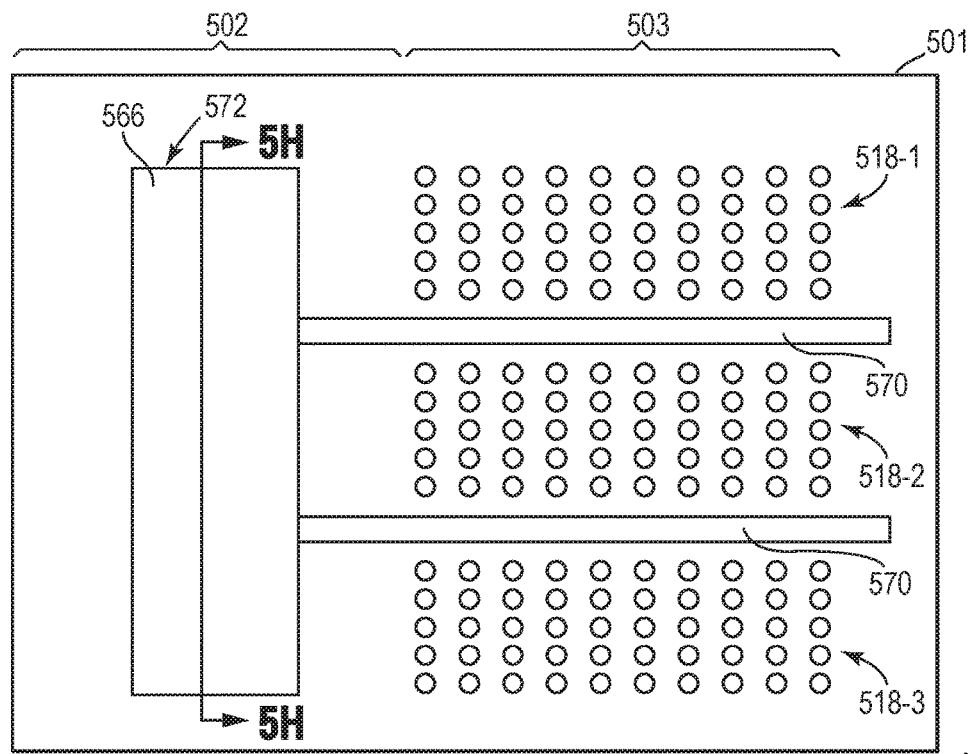
Figure 5H:
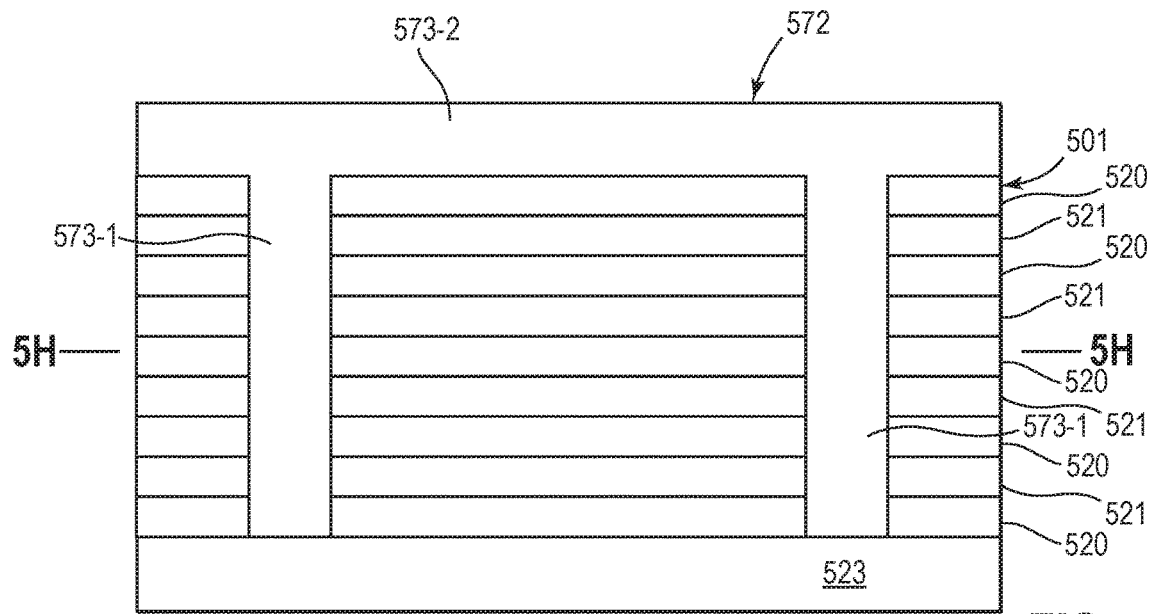

FIG. 5E is a top view corresponding to a stage of processing following the stage of processing corresponding to FIG. 5C in accordance with a number of embodiments of the present disclosure. FIG. 5F is a cross-section viewed along line 5F-5F in FIG. 5E during the processing stage corresponding FIG. 5E in accordance with a number of embodiments of the present disclosure. FIG. 5G is a top view corresponding to a stage of processing following the stage of processing corresponding to FIG. 5D in accordance with a number of embodiments of the present disclosure. FIG. 5H is a cross-section viewed along line 5H-5H in FIG. 5G during the processing stage corresponding FIG. 5G in accordance with a number of embodiments of the present disclosure.

In FIG. 5F, mask elements 567 are removed, leaving the material 566 that was covered by mask elements 567. The material 566 that is left can form termination structures 571 that are separated from each other. The removal of material 566 forms openings 570 corresponding to filled segments 551-1 in FIG. 5C and corresponding to filled portions 553-2 in FIG. 5C. For example, the respective openings 570 terminate at the respective termination structures 571.

Termination structures 571 pass through the alternating dielectrics 520 and 521 of stack 501 and can stop at an upper surface of or in semiconductor 523, as shown in FIG. 5F. In some examples, a portion of termination structures 567 can be over the upper surface of the uppermost dielectric 520 and can be wider than openings 570 in a direction transverse to openings 570. Dielectrics 520, dielectrics 521, and semiconductor 523 can be as described previously for dielectrics 220, dielectrics 221, and semiconductor 223, respectively.

In FIG. 5G, mask 568 is removed, leaving the material 566 that was covered by mask 568. The material 566 that is left can form a termination structure 572. The removal of material 566 forms openings 570 corresponding to filled segments 551-1 and filled portions 553-2 in FIG. 5D. For example, openings 570 can both terminate at termination structure 572.

Portions 573-1 of termination structure 572 pass through the alternating dielectrics 520 and 521 and can stop at an upper surface of or in semiconductor 523, as shown in FIG. 5H. For example, the respective openings 570 can respectively terminate at the respective portions 573-1. In some examples, a portion 573-2 of termination structure 572 can be over the upper surface of the uppermost dielectric 520.

In some examples, dielectrics 521 can be removed by accessing them through openings 570 to form spaces in a manner similar to that described previously in conjunction with FIG. 2P. Metal can be formed in the spaces by supplying the metal through opening 570 in a manner similar to that described previously in conjunction with FIG. 2P. The metal can form control lines coupled to select transistors adjacent to semiconductor structures 505 and access lines coupled to memory cells adjacent to semiconductor structures 505.

The termination structures 571 in FIG. 5E can prevent removal material from removing the dielectrics from around the ends of termination structures 571, which could provide a path for extraneous metal during the metal processing step. For example, the metal could cause an electrical short between access lines corresponding to group 518-1 and access lines corresponding to group 518-2 and between access lines corresponding to group 518-2 and access lines corresponding to group 518-3. Termination structure 572 in FIG. 5G can likewise prevent an electrical short between access lines corresponding to group 518-1 and access lines corresponding to group 518-2 and between access lines corresponding to group 518-2 and access lines corresponding to group 518-3.

Figure 6A:
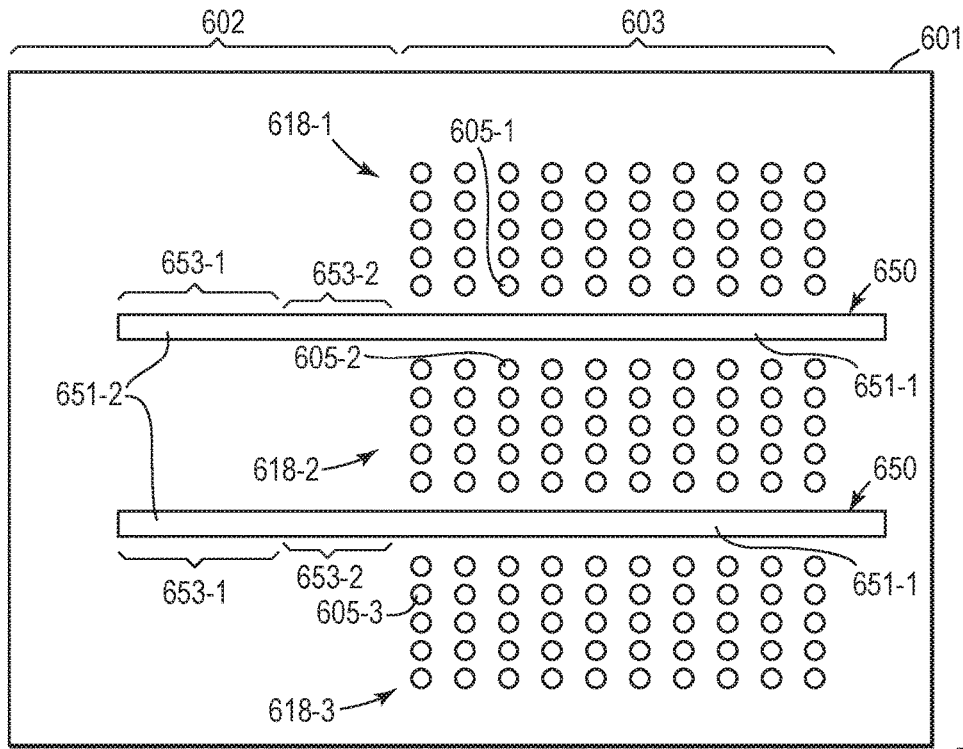
FIGS. 6A-6K are various views corresponding to particular stages of processing associated with forming a stacked memory array in accordance with a number of embodiments of the present disclosure.
Figure 6B:
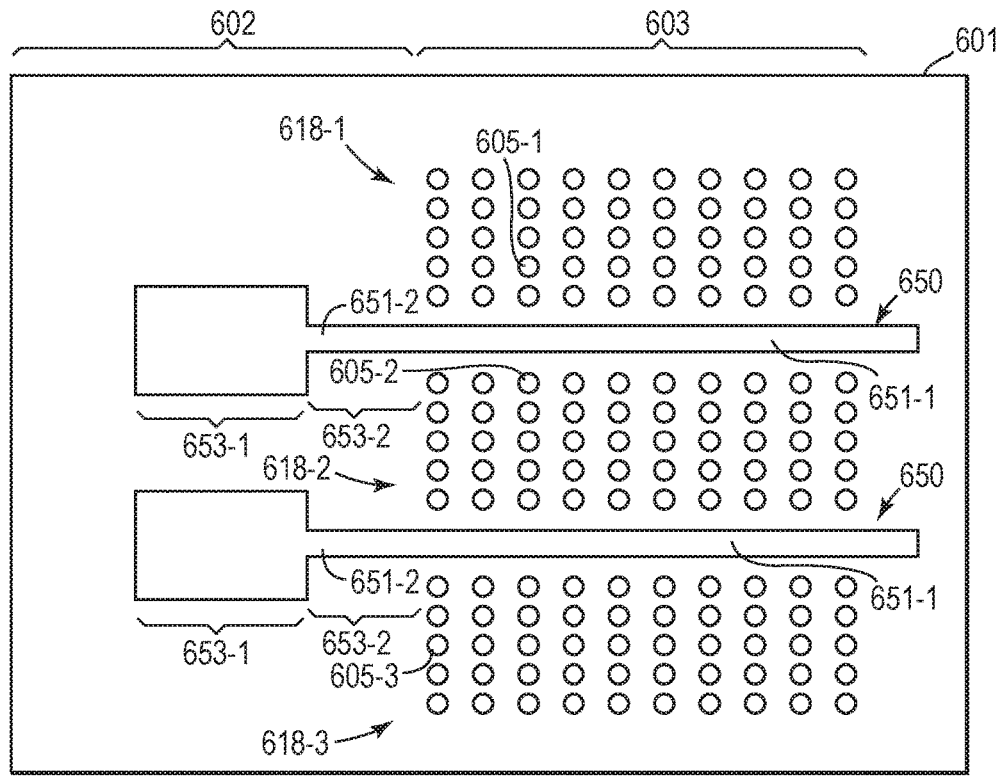

FIG. 6A is a top view corresponding to a particular stage of processing associated with forming a stacked memory array in accordance with a number of embodiments of the present disclosure. FIG. 6B is a top view corresponding to a particular stage of processing associated with forming a stacked memory array in accordance with a number of embodiments of the present disclosure.

In the example of FIGS. 6A and 6B, groups 618-1 to 618-3 of respective semiconductor structures 605-1 to 605-3 pass through a stack 601 of alternating dielectrics formed over a semiconductor. For example, stack 601 can be similar to stack 301 in FIG. 3B. In some examples, memory cells and select transistors can be partially formed adjacent to each semiconductor structure 605, as described previously in conjunction with FIG. 2E. Semiconductor structures 605 can be as described previously for semiconductor structures 205.

During the processing stage corresponding to FIGS. 6A and 6B, openings 650 are formed through stack 601 in a manner similar to forming opening 350 through stack 301, as shown in FIG. 3B. Each of openings 650 has a segment 651-1 in a region 603 of stack 601 that includes the groups 618-1 to 618-3 of semiconductor structures and a segment 651-2 in a region 602 of stack 601 that does not include the groups 618-1 to 618-3 of semiconductor structures. For example, region 603 can be referred to a memory-cell region, in that memory cells are to be formed in region 603, and region 602 can be referred to as a non-memory-cell region.

A segment 651-1 can be between groups 618-1 and 618-2, and a segment 651-1 can be between groups 618-2 and 618-3. Each segment 651-2 can include a portion 653-1 and a portion 653-2 between portion 653-1 and a segment 651-1. For example, portion 653-1 can be wider than portion 653-2 in a direction transverse to portion 653-2, as shown in FIG. 6B.

Note that openings 650 are analogous to the segments 110 of opening 108 in FIG. 1. However, the processing stage corresponding to FIGS. 6A and 6B eliminates the formation of segments 112-1 and 112-2 and thus mitigates the problems associated with the formation of segments 112-1 and 112-2.

Figure 6C:
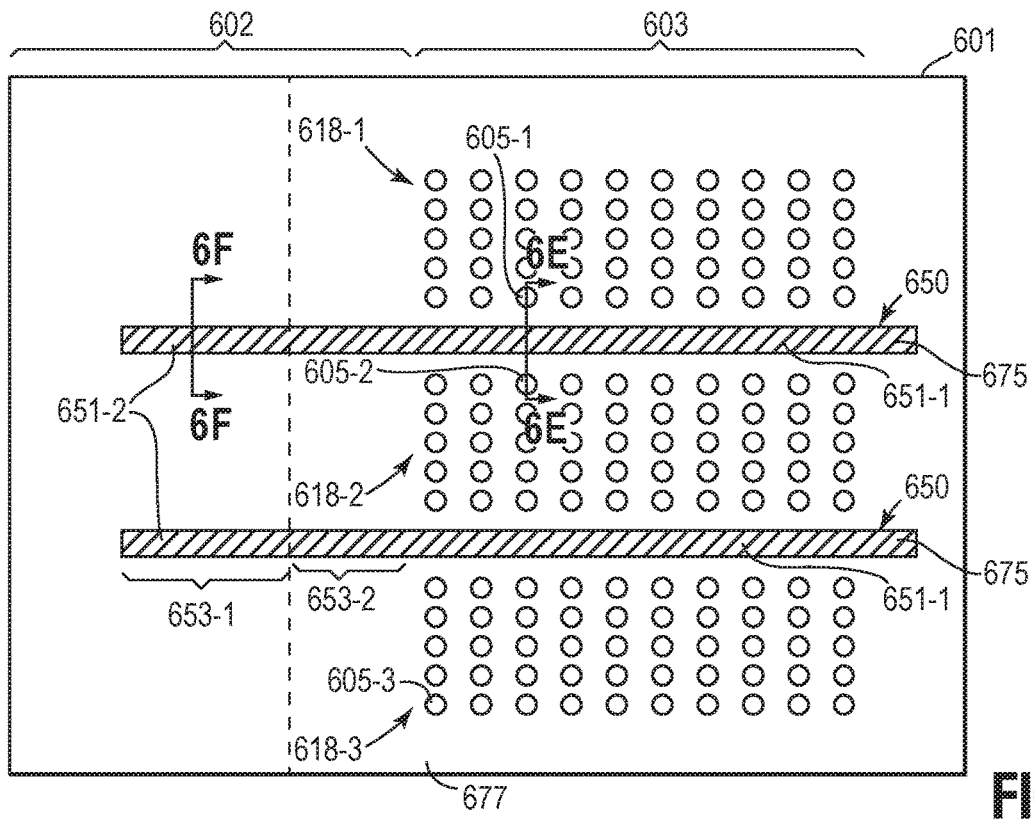
Figure 6D:
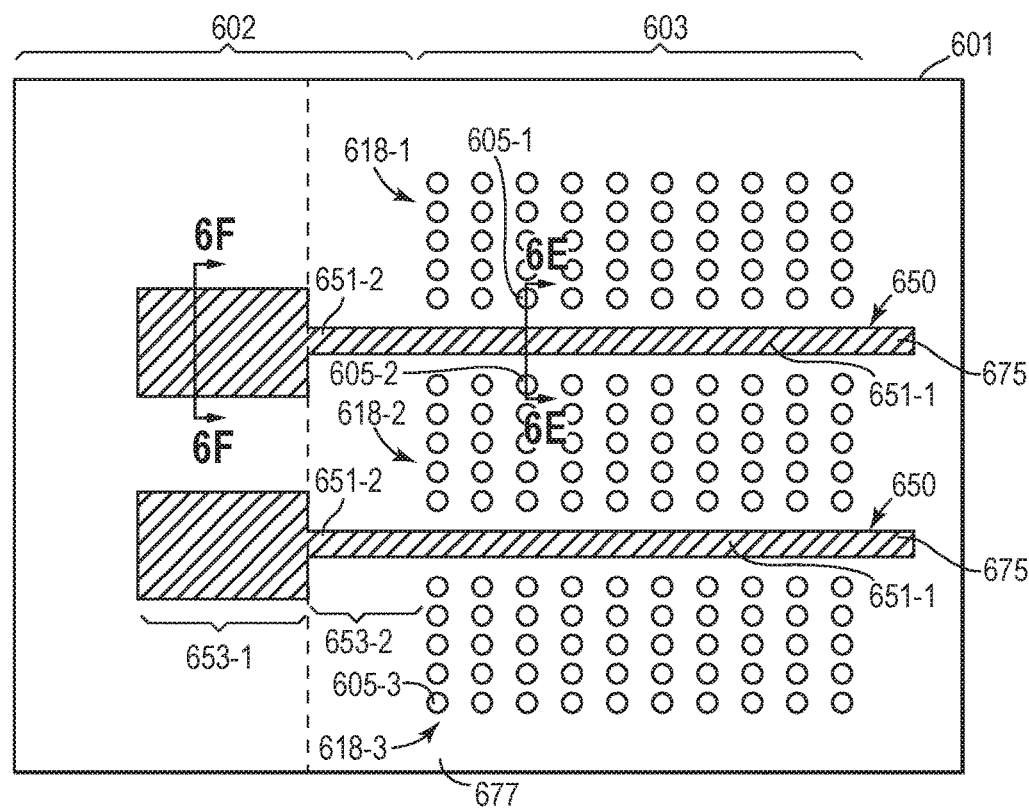
Figure 6E:
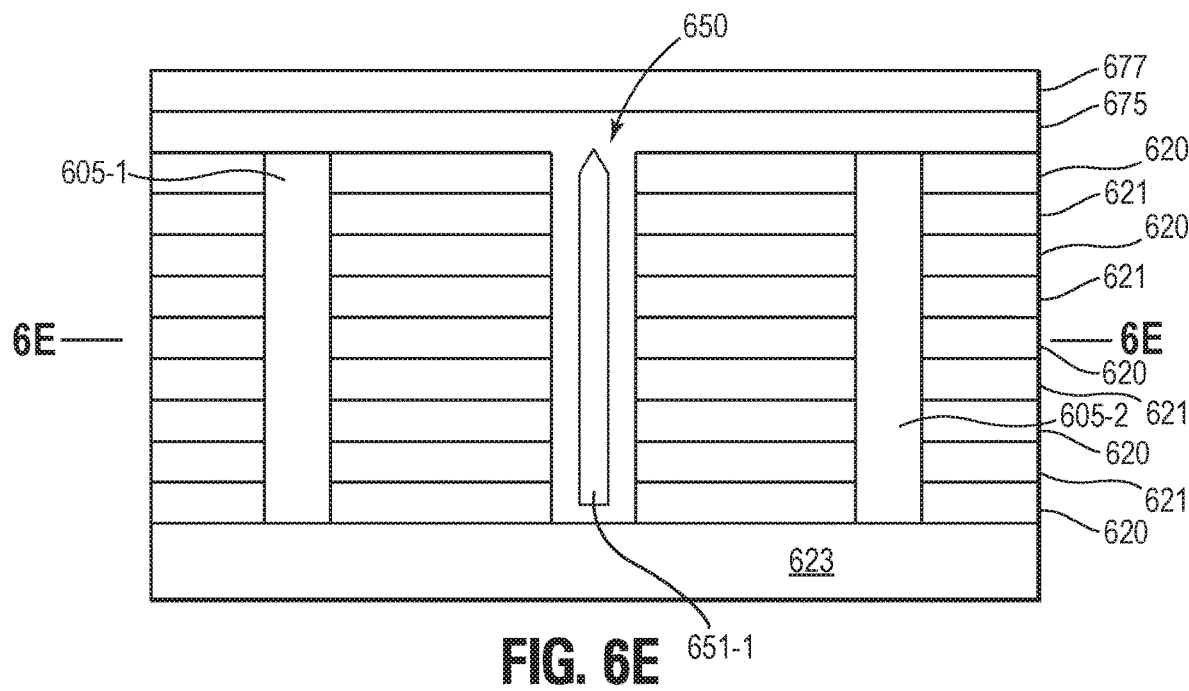
Figure 6F:
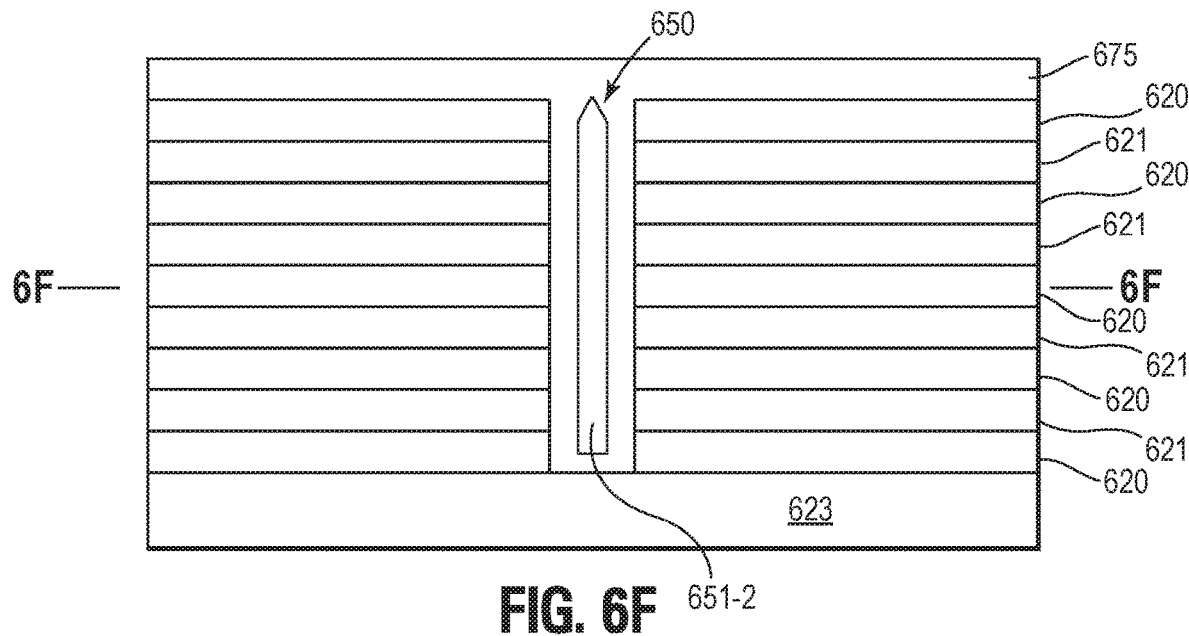

FIG. 6C is a top view corresponding to a stage of processing following the stage of processing corresponding to FIG. 6A in accordance with a number of embodiments of the present disclosure. FIG. 6D is a top view corresponding to a stage of processing following the stage of processing corresponding to FIG. 6B in accordance with a number of embodiments of the present disclosure. FIG. 6E is a cross-section viewed along line 6E-6E in FIG. 6C during the processing stage corresponding FIG. 6C and line 6E-6E in FIG. 6D during the processing stage corresponding FIG. 6D in accordance with a number of embodiments of the present disclosure. FIG. 6F is a cross-section viewed along line 6F-6F in FIG. 6C during the processing stage corresponding FIG. 6C and line 6F-6F in FIG. 6D during the processing stage corresponding FIG. 6F in accordance with a number of embodiments of the present disclosure.

In the example of FIGS. 6C to 6F, a sacrificial material 675 is formed over the uppermost dielectric 620 of stack 601 of alternating dielectrics 620 and 621 that are over semiconductor 623. Sacrificial material 675 closes off openings 650 along their entire length adjacent to the tops of openings 650. For example, sacrificial material 675 closes off segments 651-1 and 651-2. For example, sacrificial material 675 pinches off adjacent to the tops of openings 650 before completely filling openings 650. In some examples, sacrificial material 675 can be carbon. Dielectrics 620, dielectrics 621, and semiconductor 623 can be as described previously for dielectrics 220, dielectrics 221, and semiconductor 223, respectively.

A mask 677 can be formed over region 603, leaving a portion of region 602 uncovered. For example, mask 677 can cover closed-off segments 651-1, as shown in FIGS. 6C, 6D, and 6E. Closed-off segments 651-2 can be left uncovered. For example, closed-off portions 653-1 of closed-off segments 651-2 can be left uncovered and closed-off portions 653-2 of closed-off segments 651-2 between uncovered closed-off portions 653-1 and covered closed-off segments 651-1 can be covered by mask 677, as shown in FIGS. 6C and 6D.

Figure 6G:
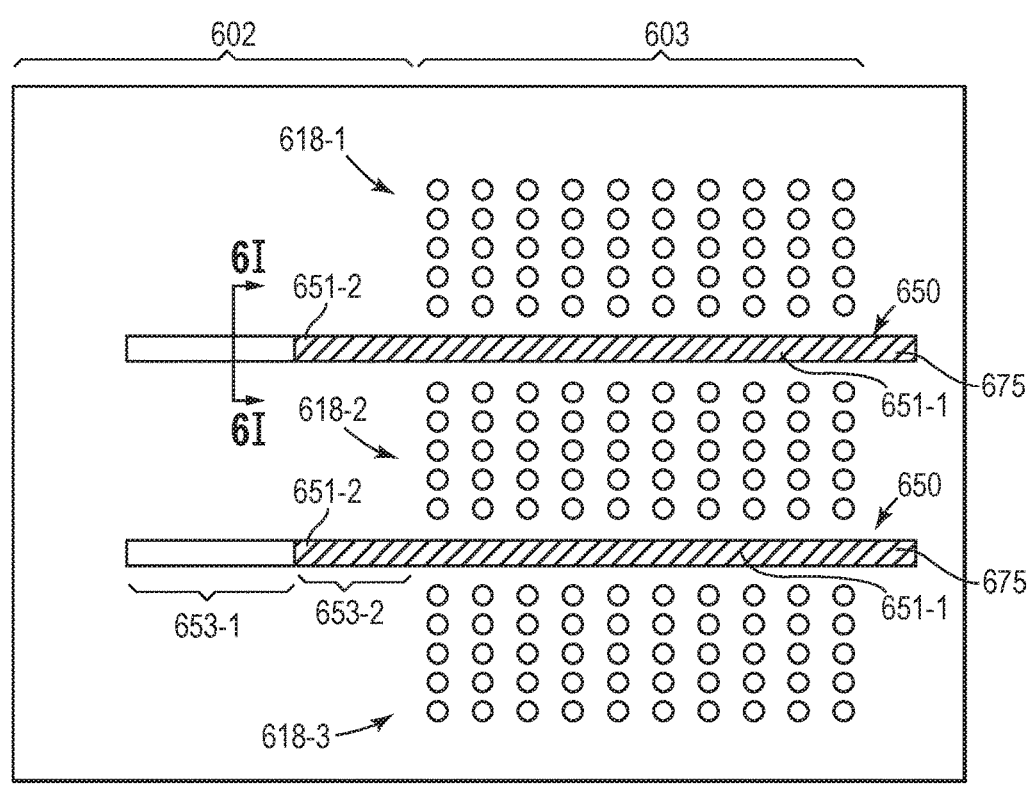
Figure 6H:
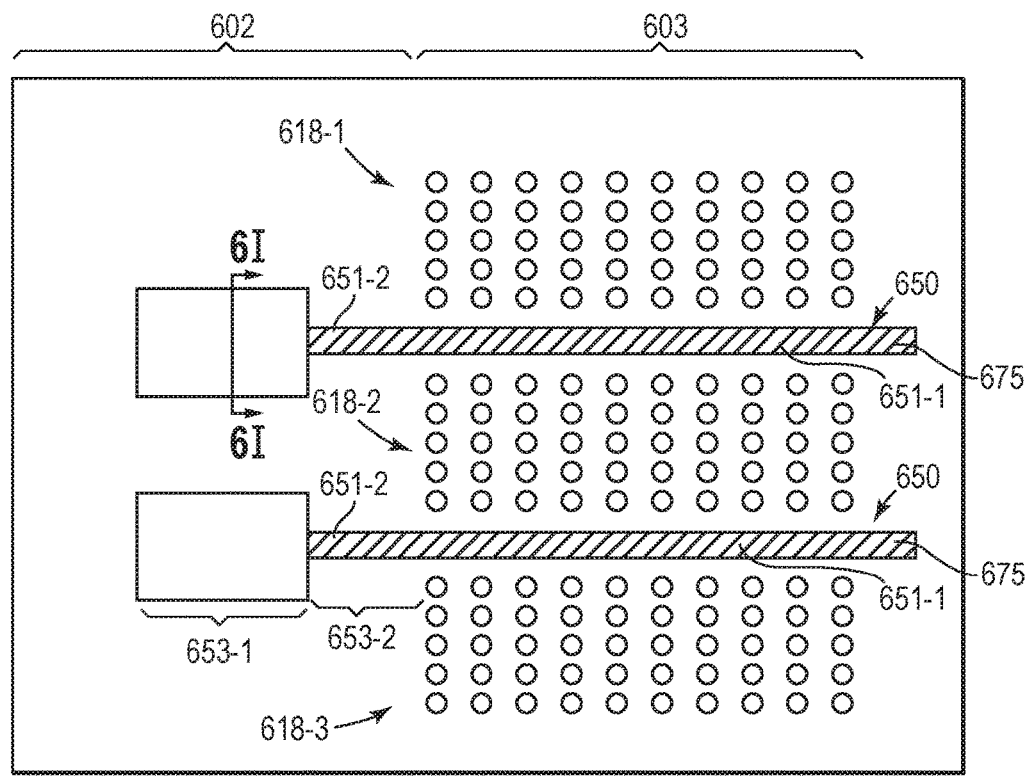
Figure 6I:
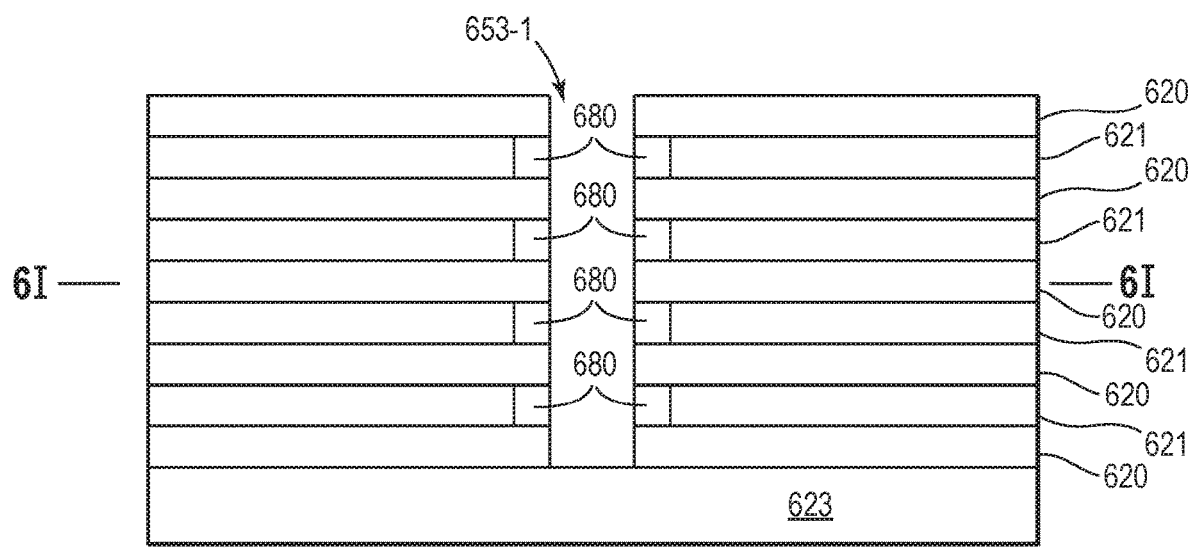

FIG. 6G is a top view corresponding to a stage of processing following the stage of processing corresponding to FIG. 6C in accordance with a number of embodiments of the present disclosure. FIG. 6H is a top view corresponding to a stage of processing following the stage of processing corresponding to FIG. 6D in accordance with a number of embodiments of the present disclosure. FIG. 6I is a cross-section viewed along line 6I-6I in FIG. 6G during the processing stage corresponding FIG. 6G, line 6I-6I in FIG. 6H during the processing stage corresponding FIG. 6H, line 6I-6I in FIG. 6J during the processing stage corresponding FIG. 6J, and line 6I-6I in FIG. 6K during the processing stage corresponding FIG. 6K in accordance with a number of embodiments of the present disclosure.

Closed segments 651-2 can be opened by removing sacrificial material 675 from segment 651-2 while mask 677 prevents sacrificial material 675 from being removed from closed segments 651-1. For example, closed portions 653-3 of closed segments 651-2 can be opened by removing sacrificial material 675 from closed portions 653-3 while sacrificial material 675 is prevented from being removed from closed segments 651-1 and from closed portion 653-2 of closed segments 651-2, as shown in FIGS. 6G to 6I. For example, removing sacrificial material 675 from closed portions 653-1 exposes alternating dielectrics 620 and 621, as shown in FIG. 6I. In some examples, mask 677 can be removed after removing sacrificial material 675.

Subsequently, a material 680 can be implanted into exposed dielectrics 621 to dope exposed dielectrics 621 with material 680. For example, material 680 can be the same material as sacrificial material 675, such as carbon. In some examples, material 680 can be implanted into exposed dielectrics 621 using plasma doping (PLAD). In some examples, doped dielectrics 621 can be carbon-doped nitride. Doped dielectrics 621 can be resistant to removal chemistries that can remove undoped dielectrics 621. The presence of sacrificial material 675 in closed-off segments 651-1 and closed-off portions 653-2 can prevent material 680 from being implanted into dielectrics 621 in region 303 and the portion of region 302 corresponding to closed-off portions 653-2.

Figure 6J:
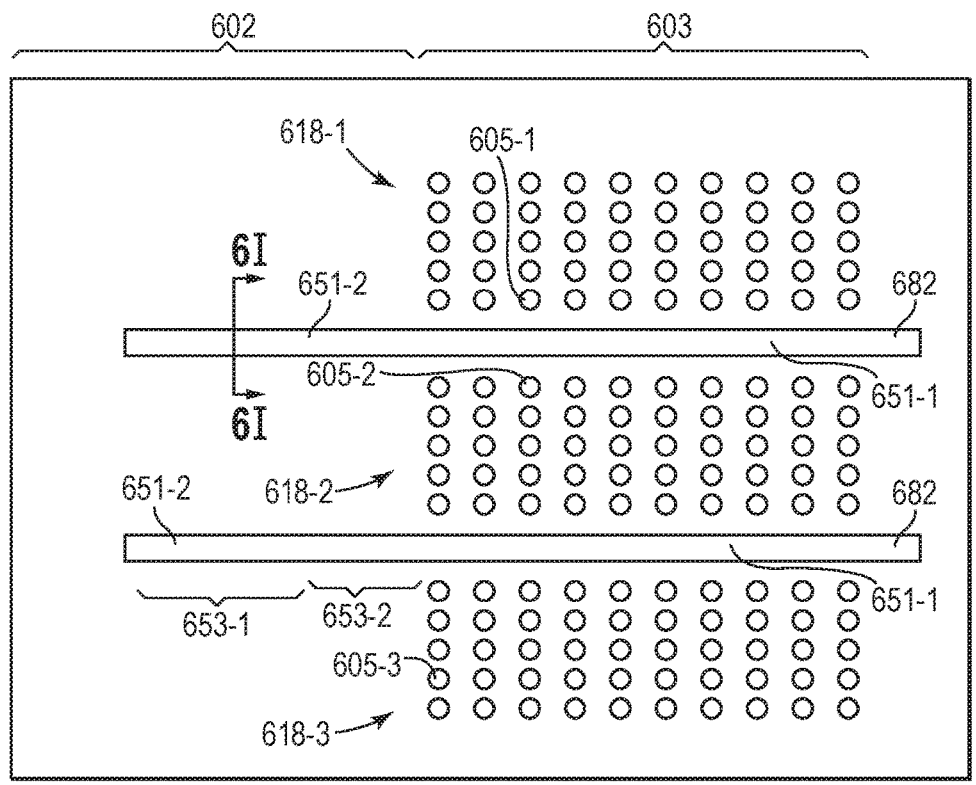
Figure 6K:
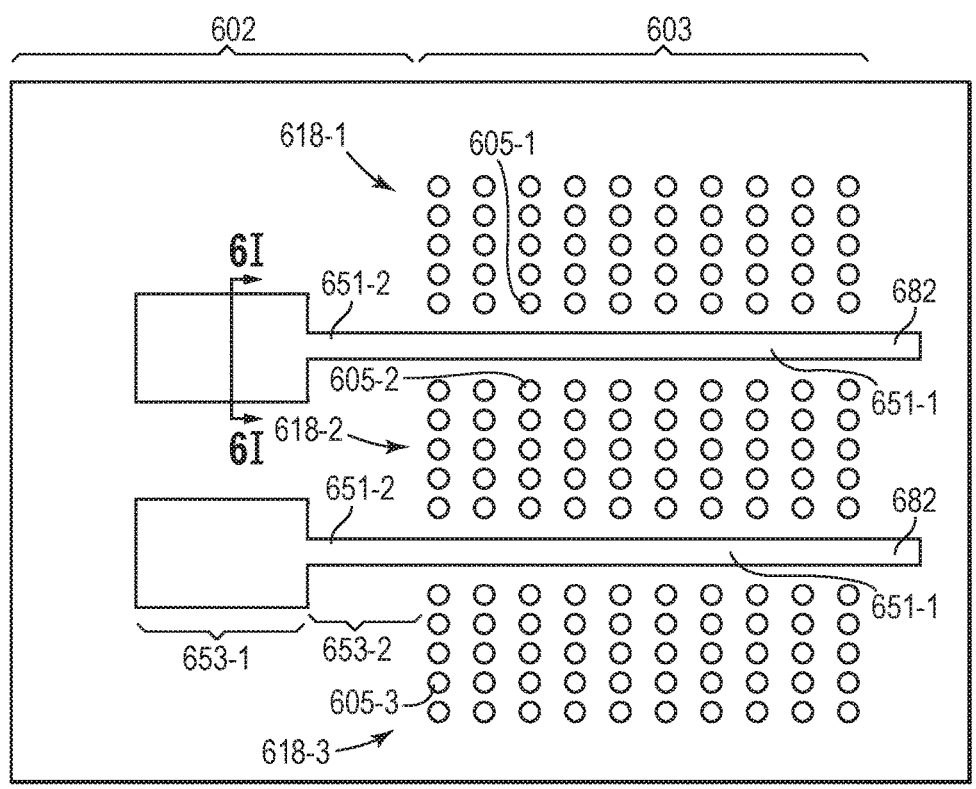

FIG. 6J is a top view corresponding to a stage of processing following the stage of processing corresponding to FIG. 6G in accordance with a number of embodiments of the present disclosure. FIG. 6K is a top view corresponding to a stage of processing following the stage of processing corresponding to FIG. 6H in accordance with a number of embodiments of the present disclosure.

Sacrificial material 675 is removed from closed-off segments 651-1 and closed-off portions 653-2 in FIGS. 6J and 6K to form openings 682. For example, openings 682 include opened segments 651-1 and opened portions 653-1 and 653-2 of opened segments 651-2.

In some examples, dielectrics 621 can be removed from region 303 by supplying removal material through opened segments 651-1 and from a portion of region 302 corresponding to opened portions 653-2 by accessing them through opened portions 653-2 to form spaces in a manner similar to that described previously in conjunction with FIG. 2P. However, doped dielectrics 621 can prevent dielectrics 621 from being removed from a portion of region 602 corresponding to opened portions 653-1. For example, doped dielectrics 621 alternating with dielectrics 220 effectively terminate openings 682, and thus can be referred to as termination structures.

Doped dielectrics 621 can prevent the removal material from removing the dielectrics 621 from around the ends of openings 682, which could provide a path for extraneous metal during a subsequent metal processing step. Forming a path for extraneous metal could cause an electrical short between access lines corresponding to group 618-1 and access lines corresponding to group 618-2 and between access lines corresponding to group 618-2 and access lines corresponding to group 618-3.

Metal can be formed in the spaces by supplying the metal through opening 570 in a manner similar to that described previously in conjunction with FIG. 2P. The metal can form control lines coupled to select transistors adjacent to semiconductor structures 605 and access lines coupled to memory cells adjacent to semiconductor structures 605.

Figure 7:
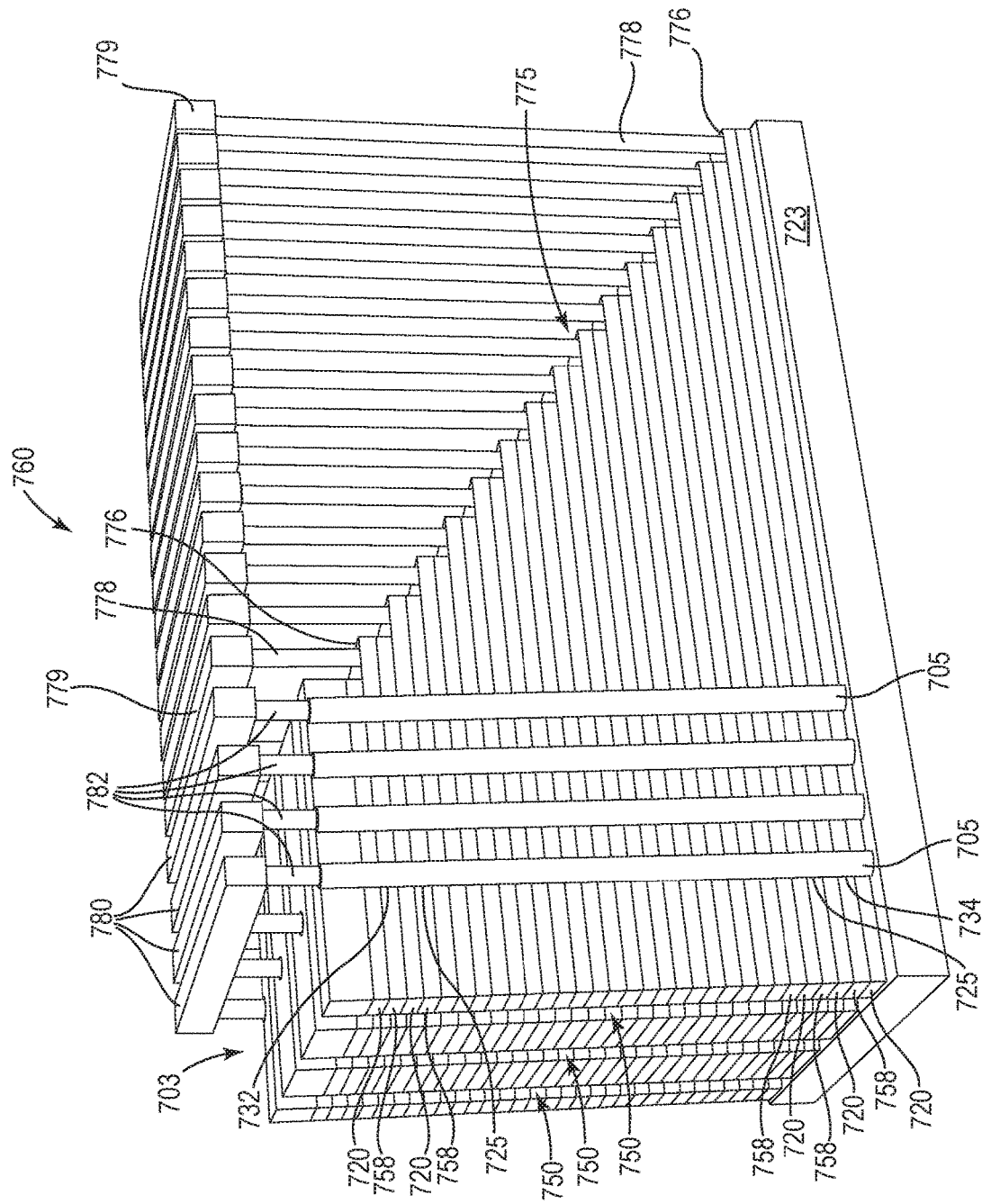
FIG. 7 illustrates a stacked memory array in accordance a number of embodiments of the present disclosure.

FIG. 7 illustrates a stacked memory array, such as stacked memory array 760, in accordance a number of embodiments of the present disclosure. For example, array 760 can include a region 703 (e.g., a memory-cell region) that can correspond to region 303, 403, 503, or 603. Array 760 includes a stair-step structure 775 adjacent to region 703.

Array 760 can include a stack of dielectrics 720 alternating with levels of metal 748. Semiconductor structures 705 pass through the stack in region 703 and terminate at an upper surface of or in a semiconductor 723. A select transistor 732 can be adjacent to each semiconductor structure 705 at a level corresponding to the uppermost level of metal 758, and a select transistor 734 can be adjacent to each semiconductor structure 705 at a level corresponding to the lowermost level of metal 758. Memory cells 725 can be adjacent to each semiconductor structure 705 at levels corresponding to the levels of metal 758 between the uppermost and lowermost levels of metal 758. For example, semiconductor structures 705, dielectrics 720, semiconductor 723, and metal 758 can be as previously described for semiconductor structures 205, dielectrics 220, semiconductor 223, and metal 258, respectively.

The uppermost and lowermost levels of metal 758 can be control lines that form or are coupled to control gates of select transistors 732 and 734, respectively. The levels of metal 758 between the uppermost and lowermost levels of metal 758 can be access lines that form or are coupled to control gates of memory cells 725.

Stair-step structure 775 includes steps 776 that can each include a respective level of metal 758 over an adjacent dielectric 720. A respective contact 778 is coupled to the level of metal 758 of each respective step 776. Respective contacts 778 are coupled to activation (e.g., access) circuitry by respective lines 779. Data lines 780 are coupled to semiconductor structures 705 by data line contacts 782.

Openings 750 are formed through the stack. Openings 350 can be as previously described for openings 250, 350, 450, 550, and 650. Openings 750 can terminate at termination structures in a manner similar to (e.g., the same as) as previously described for openings 250, 350, 450, 550, and 650.

Figure 8:
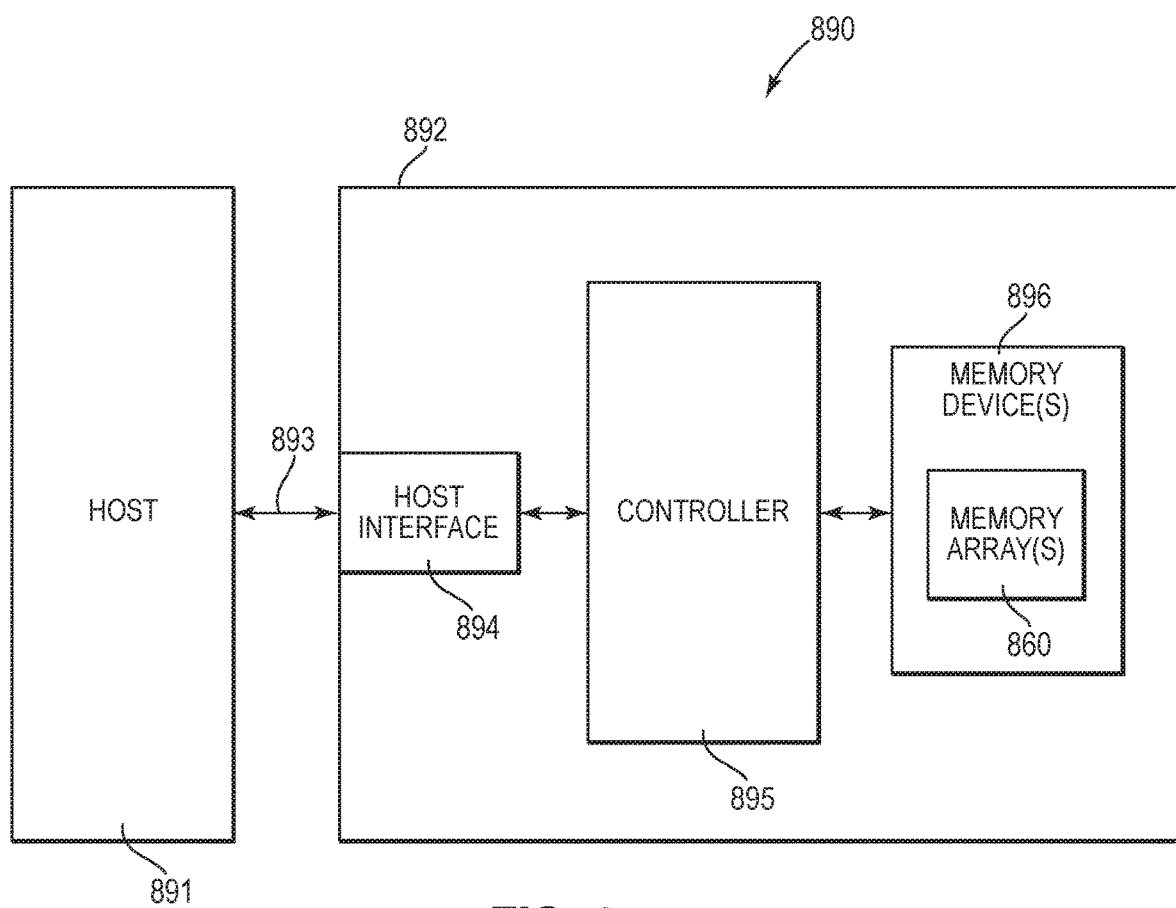
FIG. 8 is a block diagram of an apparatus in accordance a number of embodiments of the present disclosure.

FIG. 8 is a block diagram of an apparatus in accordance a number of embodiments of the present disclosure. For example, the apparatus can be an electronic system, such as a computing system 890. Computing system 890 can include a memory system 892 that can be a solid-state drive (SSD), for instance. Memory system 892 can include a host interface 894, a controller 895, such as a processor and/or other control circuitry, and a number of memory devices 896, such as NAND flash devices, that provide a storage volume for the memory system 892. A memory device 896 can have a number of memory arrays 860, such as memory array 760 shown in FIG. 7.

Controller 895 can be coupled to the host interface 894 and to the number of memory devices 896 via one or more channels and can be used to transfer data between the memory system 892 and a host 891. Host 891 can be coupled to the host interface 894 by a communication channel 893. Host 891 can be a host system such as a personal laptop computer, a desktop computer, a digital camera, a mobile telephone, or a memory card reader, among various other types of hosts.

The term semiconductor can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps may have been utilized to form regions/junctions in the base semiconductor structure, and the term semiconductor can include the underlying layers containing such regions/junctions.

As used herein, "a number of" something can refer to one or more of such things. For example, a number of memory cells can refer to one or more memory cells. A "plurality" of something intends two or more. As used herein, multiple acts being performed concurrently refers to acts overlapping, at least in part, over a particular time period. As used herein, the term "coupled" may include electrically coupled, directly coupled, and/or directly connected with no intervening elements (e.g., by direct physical contact) or indirectly coupled and/or connected with intervening elements. The term coupled may further include two or more elements that co-operate or interact with each other (e.g., as in a cause and effect relationship). It should be recognized the term parallel takes into account variations from "exactly" parallel due to routine manufacturing and/or assembly variations.

The figures herein follow a numbering convention in which the first digit or digits correspond to the drawing figure number and the remaining digits identify an element or component in the drawing. Similar elements or components between different figures may be identified by the use of similar digits. As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present disclosure and are not to be used in a limiting sense.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

What is claimed is:

1. A method of forming a stacked memory array, comprising:
   forming a stack of alternating first and second dielectrics;
   forming a termination opening through the stack;
   forming a set of contact openings through the stack concurrently with forming the termination opening;
   forming a sacrificial material lining without closing the termination opening;
   closing the contact openings with the sacrificial material without completely filling the contact openings with the sacrificial material;
   removing the sacrificial material lining the termination opening while covering the closed contact openings;
   forming a termination structure in the termination opening after removing the sacrificial material; and
   forming an additional opening through the termination structure and through the stack between first and second groups of semiconductor structures that pass through the stack.

2. The method of claim 1, wherein the sacrificial material comprises carbon.

3. The method of claim 1, wherein forming the additional opening through the termination structure results in the termination structure lining the additional opening.

4. The method of claim 1, further comprising before forming the additional opening:
   removing the sacrificial material from the contact openings; and
   forming contacts in the contact openings.

5. The method of claim 1, wherein the additional opening is a first additional opening, the method further comprising:
   forming a second additional opening through the termination structure and through the stack between the second group of semiconductor structures and a third group of semiconductor structures that passes through the stack.

6. The method of claim 5, wherein the first additional opening passes through a first portion of the termination structure and the second additional opening passes through a second portion of the termination structure that is separate from the first portion of the termination structure.

7. A method of forming a stacked memory array, comprising:
   forming a stack of alternating first and second dielectrics;
   forming an opening through the stack so that a first segment of the opening is between a first group of semiconductor structures and a second group of semiconductor structures in a first region of the stack and a second segment of the opening is in a second region of the stack that does not include the first and second semiconductor structures;
   forming a photosensitive material in the opening to form a first segment of the photosensitive material in the first region between the first and second groups and a second segment of the photosensitive material in the second region; and
   removing the first segment of the photosensitive material to form a new opening in the first region between the first group of semiconductor structures and the second group of semiconductor structures and leaving the second segment of the photosensitive material so that the new opening terminates at the second segment of the photosensitive material.

8. The method of claim 7, further comprising exposing the second segment of the photosensitive material to electromagnetic radiation and leaving the first segment of photosensitive material unexposed.

9. The method of claim 7, further comprising exposing the first segment of the photosensitive material to electromagnetic radiation and leaving the second segment of photosensitive material unexposed.

10. The method of claim 7, further comprising leaving a portion of the first segment of the photosensitive material that is adjacent to the second segment of the photosensitive material.

11. The method of claim 7, wherein
   the second segment of the photosensitive material comprises a first portion and a second portion between the first portion and the first segment of the photosensitive material;
   the first portion is wider than the second portion in a direction that is transverse to the first portion; and
   the method further comprises removing the second portion to form an additional portion of the new opening that terminates at the first portion.

12. The method of claim 7, wherein the photosensitive material is a photosensitive spin on dielectric material.

13. A method of forming a stacked memory array, comprising:
forming a stack of alternating first and second dielectrics;
forming first and second openings through the stack so that a group of semiconductor structures in a first region of the stack is between a first segment of the first opening and a first segment of the second opening and so that second segments of the first and second openings extend into a second region of the stack that does not include the semiconductor structures;
depositing a material over an upper surface of the stack to cover the upper surface with the material and to fill the first and second segments of the first and second openings with the material;
covering the material in the second region with a mask so that the filled second segments of the first and second openings are covered and leaving the material in the filled first segments of the first and second openings uncovered;
removing the uncovered material, including the material in the filled first segments of the first and second openings to form third and fourth openings respectively corresponding to the first segments of the first and second openings so that the group of semiconductors is between the third and fourth openings; and
removing the mask leaving the material in the second region so that the unfilled third and fourth openings terminate at the material.

14. The method of claim 13, wherein the third and fourth openings respectively terminate at portions of the material that are separated from each other.

15. The method of claim 13, further comprising:
leaving a portion of the material in the second region between the mask and the first region uncovered;
wherein removing the uncovered material comprises removing the material from portions of the filled second segments of the first and second openings to form extensions of the third and fourth openings in the second region respectively corresponding to the portions of second segments of the first and second openings;
wherein the extensions of third and fourth openings terminate at respective portions of the material in the second region.

16. The method of claim 15, wherein the respective portions of the material in the second region are separated from each other.

17. The method of claim 16, wherein the respective portions of the material are wider than the extensions of third and fourth openings in a direction transverse to the extensions of third and fourth openings.

18. The method of claim 13, wherein the material is selected from the group consisting of polysilicon, polysilicon and oxide, and nitride and oxide.

* * * * *